United States Patent
Ewers et al.

(10) Patent No.: US 7,565,253 B2
(45) Date of Patent: Jul. 21, 2009

(54) HIGH-VOLTAGE POWER SUPPLY CONTROL SYSTEM AND WIRELESS CONTROLLER AND METHOD THEREFOR

(75) Inventors: Christopher F. Ewers, New Milford, CT (US); Michael J. Sowerby, New Milford, CT (US)

(73) Assignee: Hubbell Incorporated, Orange, CT (US)

( * ) Notice: Subject to any disclaimer, the term of this patent is extended or adjusted under 35 U.S.C. 154(b) by 503 days.

(21) Appl. No.: 11/216,463

(22) Filed: Sep. 1, 2005

(65) Prior Publication Data

US 2007/0050159 A1 Mar. 1, 2007

(51) Int. Cl.
*G01R 19/00* (2006.01)
*H04Q 7/20* (2006.01)

(52) U.S. Cl. .................... 702/64; 340/870.02
(58) Field of Classification Search .............. 455/226.1, 455/226.4, 423–425; 324/126, 76.11; 340/870.17, 340/870.02; 702/60–62, 64–65
See application file for complete search history.

(56) References Cited

U.S. PATENT DOCUMENTS

| | | | |
|---|---|---|---|
| 3,609,523 A | 9/1971 | Knox | |
| 3,991,367 A | 11/1976 | Chapman et al. | |
| 4,384,289 A | 5/1983 | Stillwell et al. | |
| 4,684,887 A | 8/1987 | Stewart | |
| 4,714,893 A | 12/1987 | Smith-Vaniz | |
| 4,794,327 A | 12/1988 | Fernandes | |
| 5,136,285 A | 8/1992 | Okuyama | |
| 5,426,360 A | 6/1995 | Maraio et al. | |
| 5,640,155 A | 6/1997 | Springer | |
| 5,815,956 A | 10/1998 | Lavin et al. | |
| 6,014,083 A | 1/2000 | Bauerschmidt et al. | |
| 6,177,884 B1 | 1/2001 | Hunt et al. | |
| 6,239,723 B1 | 5/2001 | Bauerschmidt et al. | |
| 6,617,840 B2 | 9/2003 | Bierer | |
| 6,711,512 B2 | 3/2004 | Noh | |
| 6,778,921 B2 | 8/2004 | Keane | |
| 7,058,524 B2* | 6/2006 | Hayes et al. | ........... 702/62 |
| 7,076,378 B1* | 7/2006 | Huebner | ........... 702/69 |
| 2001/0040446 A1 | 11/2001 | Lapinksi et al. | |
| 2003/0117146 A1 | 6/2003 | Thibedeau et al. | |
| 2004/0178918 A1 | 9/2004 | Lockhart et al. | |
| 2004/0183522 A1 | 9/2004 | Gunn et al. | |
| 2005/0030693 A1 | 2/2005 | Deak et al. | |

* cited by examiner

*Primary Examiner*—Lee Nguyen
(74) *Attorney, Agent, or Firm*—Stanislav Torgovitsky; Mark S. Bicks; Alfred N. Goodman

(57) ABSTRACT

Wireless controller, a system implementing a wireless controller and a method which allows wireless control of high voltage test modules utilize wireless networking technology for the control and monitoring of High Voltage test equipment providing, for example, a completely galvanically isolated controller for High Voltage test modules. Utilizing wireless networking, with controller/regulator tied as talker/listener to reduce possibility of outside access to local network. Controller may be battery powered to provide full isolation of user from high voltage equipment. Other accepted group members can be added to monitor operations remotely with minimal possibility of outside intervention.

26 Claims, 27 Drawing Sheets

System Setup

| | | |
|---|---|---|
| Number Of Modules : | 2 | NOTE: No. of modules and Ramp Rate are required for Auto and Manual Modes. |
| Ramp Rate : | Slow | |
| Timer Mode : | Manual | |

| | | |
|---|---|---|
| Automatic Test File Name : | Deault Set | |
| Maximum Test Voltage : | 50.00 | kV |
| Hold Time : | 00:00:30 | (HH:MM:SS) |
| Number of Steps : | 1 | |
| Step Hold Time : | 00:00:10 | (HH:MM:SS) |

Use UP / Down to move between fields and the Rotary Knob to Change the Value
Use save to store settings for future use.

| DOWN | UP | Load | Save | Calibrate | Exit |

FIG. 7

HIGH-VOLTAGE POWER SUPPLY CONTROL SYSTEM AND WIRELESS CONTROLLER AND METHOD THEREFOR

BACKGROUND OF THE INVENTION

1. Field of the Invention

The present invention is directed in general to systems and methods for controlling and monitoring of high voltage test equipment, and in particular to a wireless controller, a system implementing a wireless controller and a method which allows wireless control of high voltage test modules.

2. Discussion of the Background

High voltage test systems are widely employed in utility and manufacturing industry for hipot testing of cables, electrical switchgear, motors and generators, and other electrical devices and installations.

Conventional power line monitors, as well as methods of monitoring associated with the use thereof are described in, for example, U.S. Pat. No. 5,426,360, the disclosure of which is hereby incorporated by reference, to Mario et al. which provides a system for unintrusively determining parameters such as current, voltage and power delivered through a service line to a customer for verifying accuracy of the customer's entrance meter is. The system includes a sensor apparatus for monitoring voltage and current on the power line. A voltage clamp mechanism is disposed within a sensor housing such that an insulation piercing voltage sensor can be manually actuated to pierce the electrical insulation of the power line and contact the conductor. The sensor apparatus also includes a split-core current transformer fabricated to minimize the air gap between the split-core sections when the apparatus is closed about the power line. A pole unit is electrically connected to each sensor apparatus for monitoring the voltage and current, calculating the power consumed in kilowatt-hours and storing calculated kilowatt-hours in memory with an appropriate date/time stamp, for subsequent retrieval and comparison with the customer's entrance meter readings. Data retrieval is accomplished via a hand-held ground unit, such as a palm top computer, which communicates via infrared signals with the pole mounted unit.

Other related conventional systems are described in the following documents whose disclosure is hereby incorporated by reference:

(1) U.S. Pat. No. 6,711,512 to Noh which provides pole transformer load monitoring system using a wireless Internet network. The load monitoring system is capable of measuring, in real time, a variety of load parameters (phase voltages, phase currents and temperatures) of a pole transformer placed on a distribution line. The results of the measurements are transferred to an operator in a branch operating station over the wireless Internet network so as to prevent losses resulting from overloaded and unbalanced states, thereby enhancing the quality of power supply and efficiently managing a distribution load.

(2) U.S. Pat. No. 5,136,258 to Okuyama which provides a portable data transmitting/receiving apparatus where a receiver receives measurement data output as a radio wave from a measuring unit for measuring a physical or chemical value of an object to be measured together with a data type (ID data) for identifying the measuring unit. The measurement data and the data type received by the receiver are displayed on a display unit for a predetermined period of time and is stored in a data memory. It is confirmed whether the measurement data and the data type are properly stored, by comparing the displayed data on a display portion of the measuring unit with the displayed data on the display unit. When a cancel key of a keyboard is operated, latest measurement data and a latest data type which are stored last in the data memory are cleared. Measurement data obtained by the measuring unit and input through the keyboard and a data type assigned to the measuring unit are displayed on the display unit for a predetermined period of time and are stored in the data memory. When a transmission key of the keyboard is operated, all the measurement data stored in the data memory is output from a transmitter to an external data processing unit together with data type by radio transmission.

(3) Published U.S. Patent Application Pub. No. US2004/0183522 to Gunn et al. which provides an apparatus for sensing the current in a power line of a power system and systems incorporating the apparatus are disclosed. The apparatus may comprise an enclosure providing a window operable to permit the passage of the power line therethrough. The apparatus may further comprise an active current transformer set within the enclosure and operative to produce a scaled version of the current. The apparatus may further comprise an amplifier coupled with the active current transformer and operative to reduce the phase shift and ratio error between the current and the scaled version of the current. The apparatus may further comprise a powering current transformer set within the enclosure and operative to receive power from the power line on a primary winding and deliver power on a secondary winding. The apparatus may further comprise power supply circuitry set within the enclosure, the power supply circuitry powered through the secondary winding from the powering current transformer and operative to supply power to the amplifier. The apparatus may further comprise at least one of secondary leads and secondary terminals extending from the enclosure, coupled with the active current transformer and operative to deliver the scaled version of the current outside of the enclosure.

(4) Published U.S. Patent Application Pub. No. US2001/0040446 to Lapinski et al. which provides Apparatus and method for the measurement and monitoring of electrical power generation and transmission which allows for a determination of the amount and direction of electric power flowing over a particular high-voltage electric power transmission line without proximate access to said transmission line, and further allows for a determination of the amount of electric power being produced by any particular electric power generation plant connected to an electric power transmission grid All of the foregoing devices retain the drawback of not providing the flexibility and modular construction, as afforded by, for example, Modular Portable DC Hipot tester model 8175-PL (General Description and User's Guide thereof are set forth herein in the following Appendix section of the specification) manufactured by HIPOTRONICS, combined with portability and safety afforded by wireless operation in a wireless network setting. As illustrated in FIGS. 1a and 1b, a modular portable tester includes a module assembly 150 comprises a controller 100. FIG. 1b shows modular assembly 150 with components 110, controller 100 and transformer 130. As shown in FIG. 1c, components 110 can include varying numbers of stack modules 112, and include jumper wires 114, spacer 116, base 118, termination spacer assembly 120 and spinning corona 122.

SUMMARY OF THE INVENTION

The present invention provides, inter alia, a wireless controller which may incorporate an LCD display, a single board PC with hard drive and wireless interface along with press buttons and a rotary encoder for user input.

In an exemplary embodiment of a wireless controller according to the present invention, wireless control is achieved by using the Ethernet output of the single board PC into an IEEE 802.11 wireless access point.

According to another exemplary embodiment, a controller according to the present invention is designed to be portable having at least three options of power supply, including at least one of a local mains supply via included external adapter, a 12 v vehicle power outlet, and an internal battery (which may typically proved approximately two hours of operation when fully charged).

Another exemplary embodiment of the present invention provides software for the controller which allows a user to monitor both current and voltage output from a system employing the controller, and to input at least one of test voltage, test current and test time.

According to an exemplary implementation of the present invention, results may be stored on, for example, a hard drive and available via a USB interface.

According to an embodiment of the present invention a high voltage power supply system comprises a controller which, may be implemented as a PC with a wireless interface, a high voltage power supply control system with a wireless interface, and a high voltage multiplier section.

According to another exemplary embodiment of the present invention, a method is provided which comprises controlling a high voltage output, regulating both voltage and current based on information received from the controller, and in the event that the wireless link is lost, removing output to the high voltage power supply.

According to an exemplary implementation and method of the present invention, power supply control system output is connected to a high voltage multiplier section, which generates a high voltage output proportional to the power supply control system output. The current and measurement system allows reading out of an auto transformer voltage and current along with high voltage output voltage and current. An analog meter may be provided to indicate high voltage output.

According to another exemplary implementation of the present invention, a wireless method of controlling a high voltage power supply utilizing IEEE 802.11 networking can be extended to include a range of testing and measuring equipment where each of these can then be controlled wirelessly.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 7 shows an exemplary implementation of a set up operation according to an embodiment of the present invention.

DESCRIPTION OF THE EXEMPLARY EMBODIMENTS OF THE INVENTION

Figure 1A:
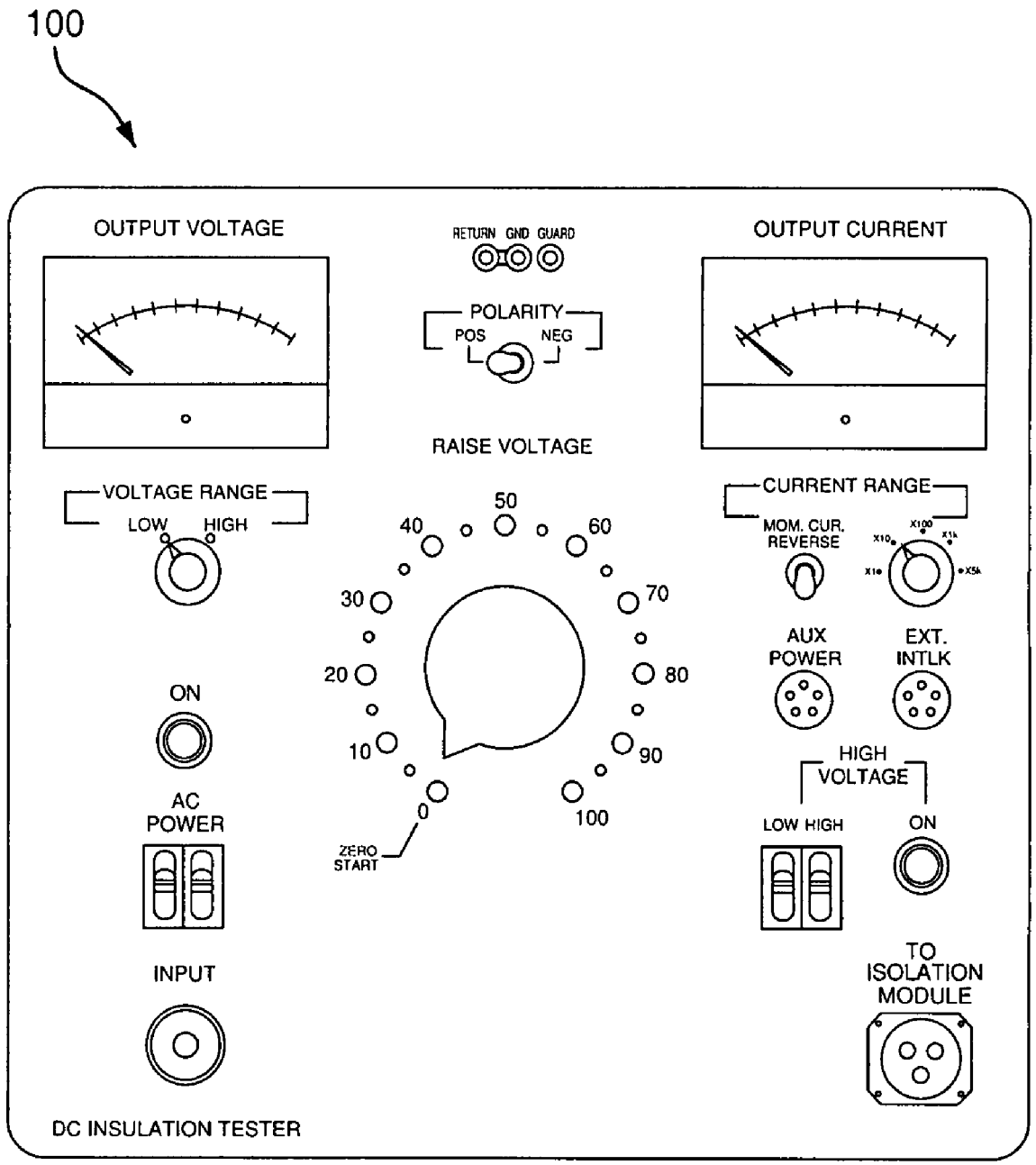
FIGS. 1a-1c show an exemplary modular portable hipot tester.
Figure 1B:
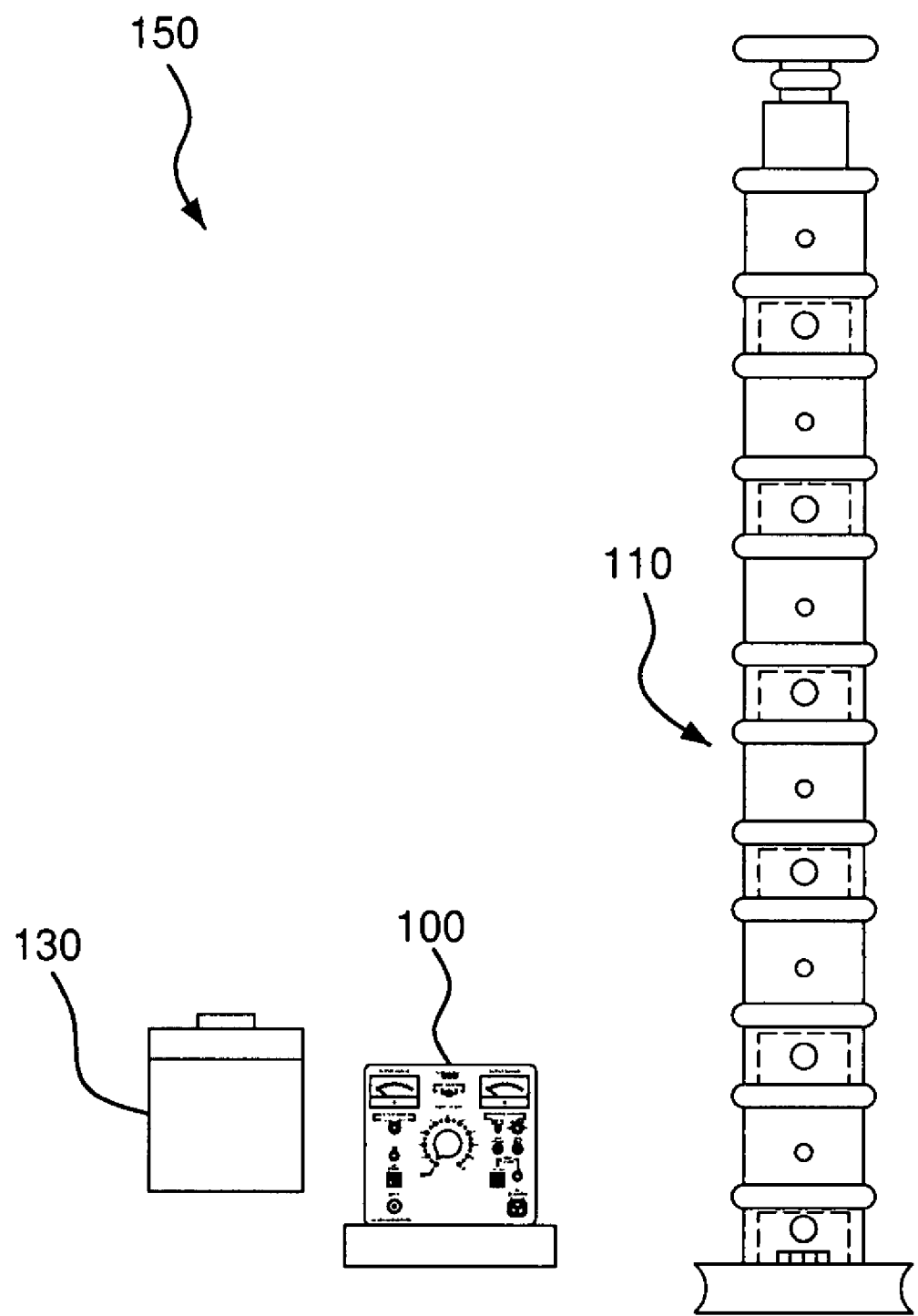
Figure 1C:
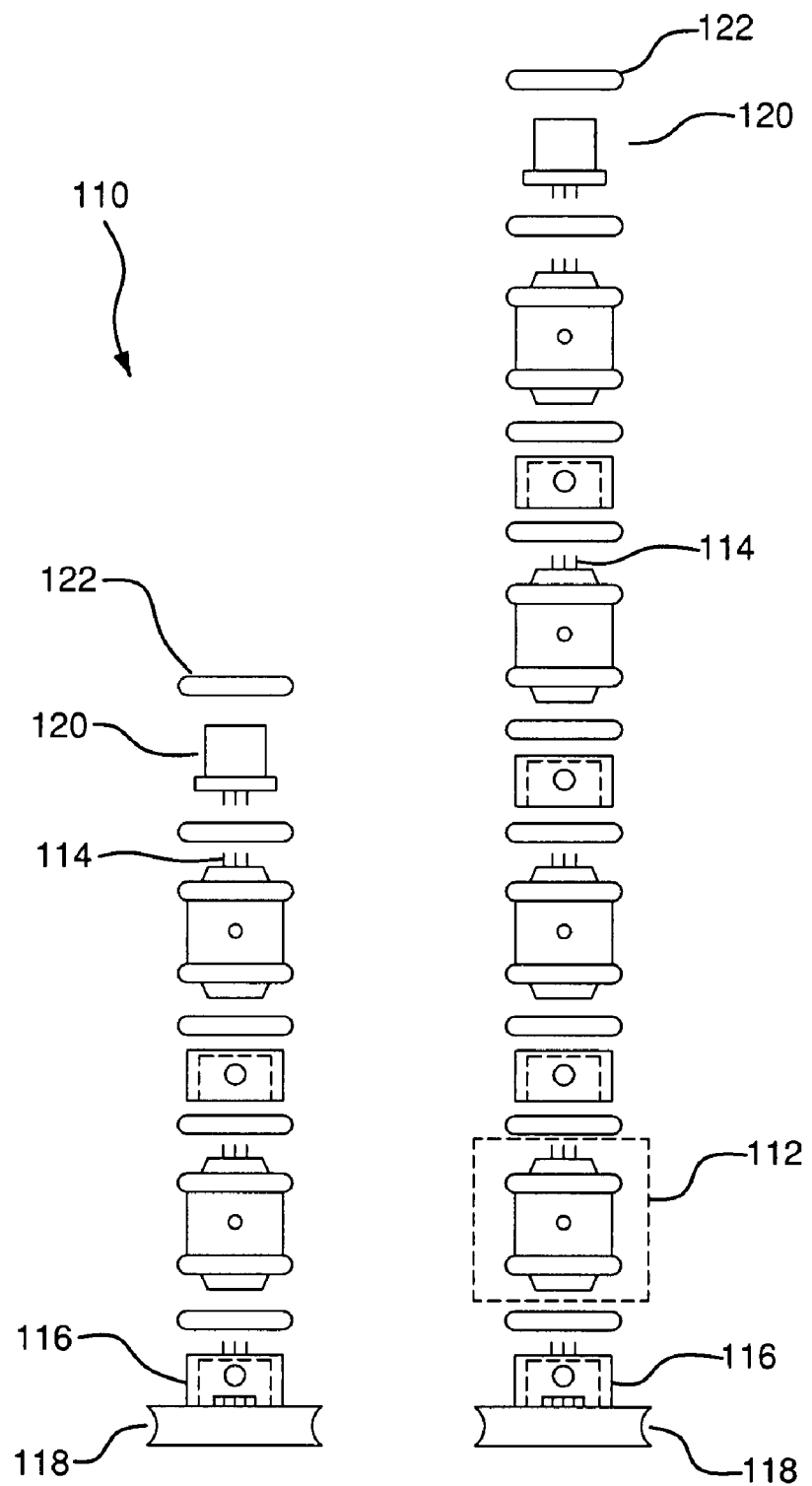

Referring now to the drawings, wherein like reference numerals designate identical or corresponding parts throughout the several views, embodiments of the present invention are shown in schematic detail.

A controller and an assembly for a system according to an exemplary embodiment of the present invention, is illustrated in FIGS. 2a-2c and FIGS. 3a-3c.

Referring to FIGS. 2a-2c, 3a and 3b, an exemplary implementation of a controller 300 comprises an LCD display 310, for example 6.5"×9" in size and having approx 600×480 resolution, small IBM compatible single board PC 320 with hard drive and wireless interface along with press buttons 330 and a rotary encoder 340 for user input.

In an exemplary implementation, wireless control is achieved by using the Ethernet output of the single board PC into an IEEE 802.11 wireless access point. IEEE 802.11 was chosen for it's resilience to interference and it's built in networking capabilities. The controller is designed to be completely portable having 3 options of power supply:

From the local mains supply via included external adapter.

From a 12 v vehicle power outlet.

From an internal battery (approx 2 hours operation on fully charged battery).

The software included with the controller allows the user to monitor both current and voltage output from the system, and to input required test voltage, current and test time if required. Results are stored to the hard drive and available via the USB interface.

An exemplary implementation of a high voltage power supply control system is described as follow.

Referring to FIGS. 2a-2e and 3c, a system 395 (ee FIG. 3c), according to an exemplary implementation, houses a PLC controller, IEEE 802.11 wireless access point, motorized auto transformer, current and voltage measurement systems, safety interlock and analog voltage meter. It is powered from a local AC power supply. The control system communicates with the controller via an IEEE 802.11 wireless access point and Ethernet connection to the PLC.

Figure 2A:
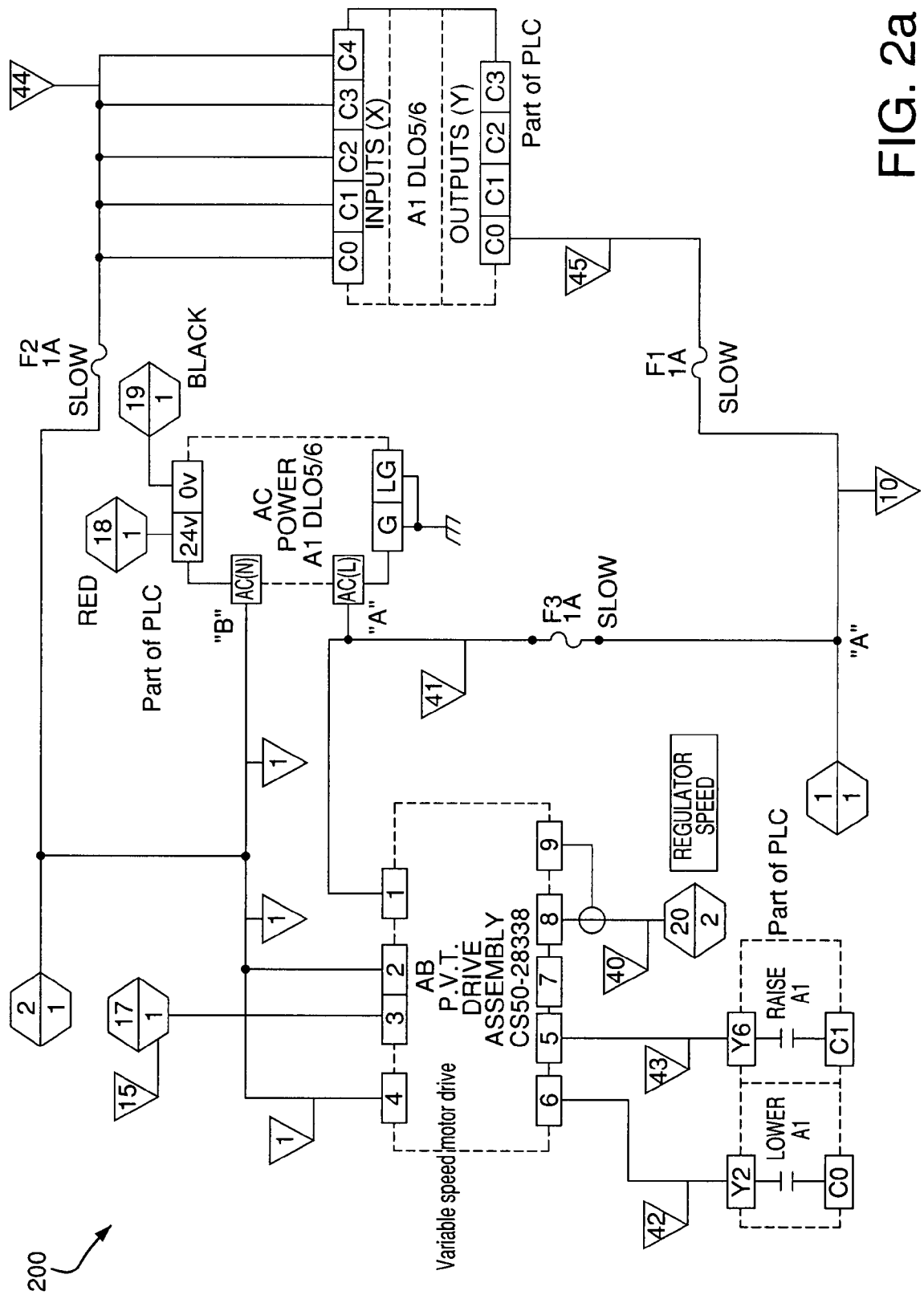
FIGS. 2a-2n show an example of an implementation of an embodiment of the present invention.
Figure 2B:
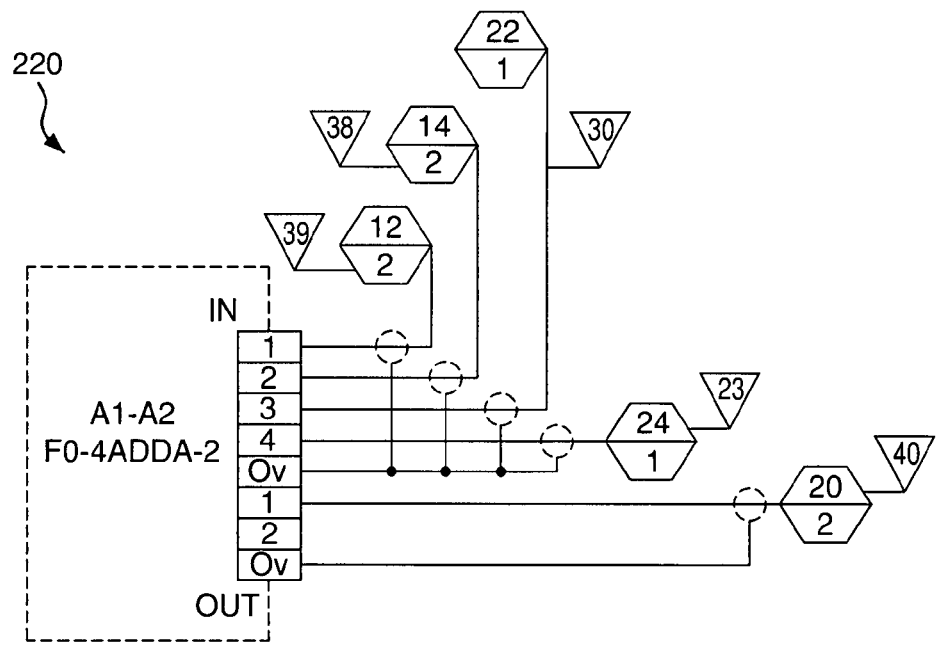
Figure 2C:
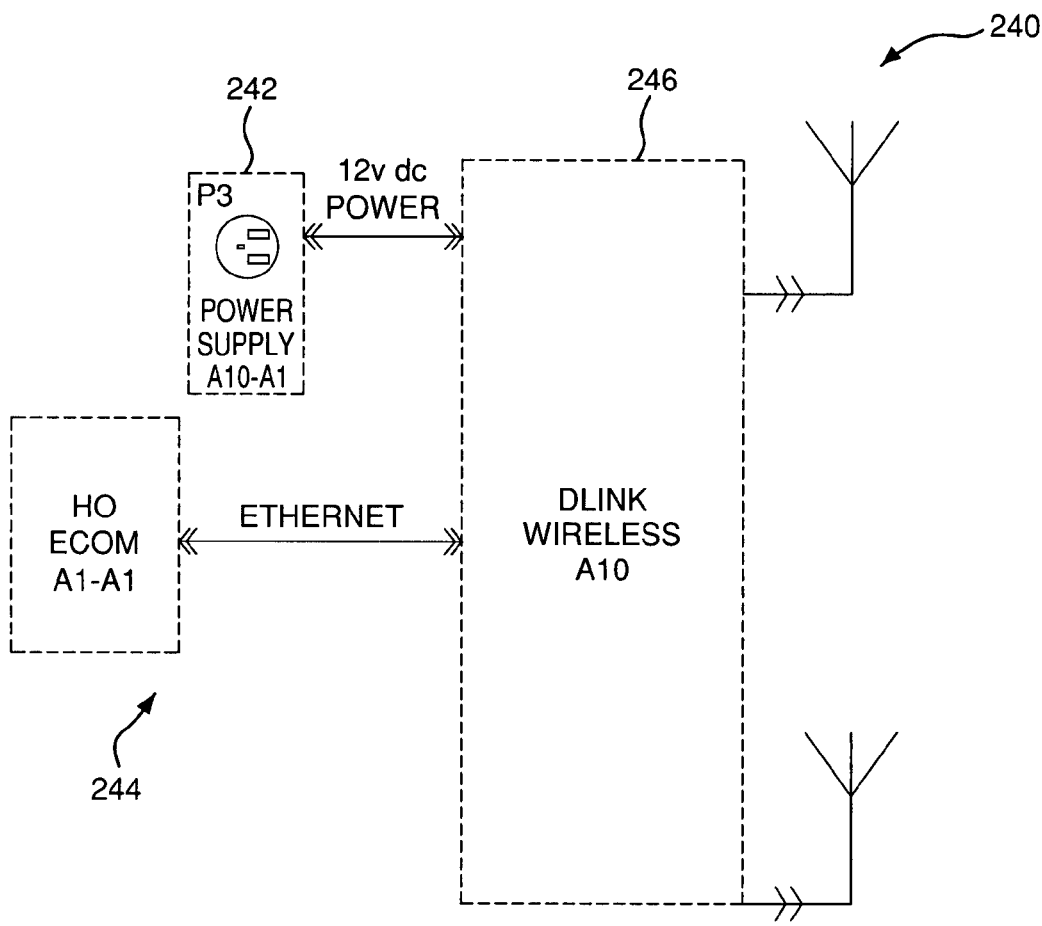

FIG. 2c illustrates an exemplary implementation 240 of Ethernet to wireless bridge using 802.11 access point 246 and power supply 242. Ethernet adapter for PLC 244 allows communication to/from the PLC via a 10T Ethernet link. The Ethernet to wireless bridge allows other users who have permission to access the device. The PLC controls the High voltage output and -regulates both voltage and current based on information received from the controller. In the event that this wireless link is lost, the PLC will safely remove output to the HV power supply. External safety interlock is provided by plug P2. When there is no connection between the power pins on this connector, High voltage is turned off. The power supply control system output is connected to the high voltage multiplier section, which generates a high voltage output proportional to the power supply control system output.

Figure 2D:
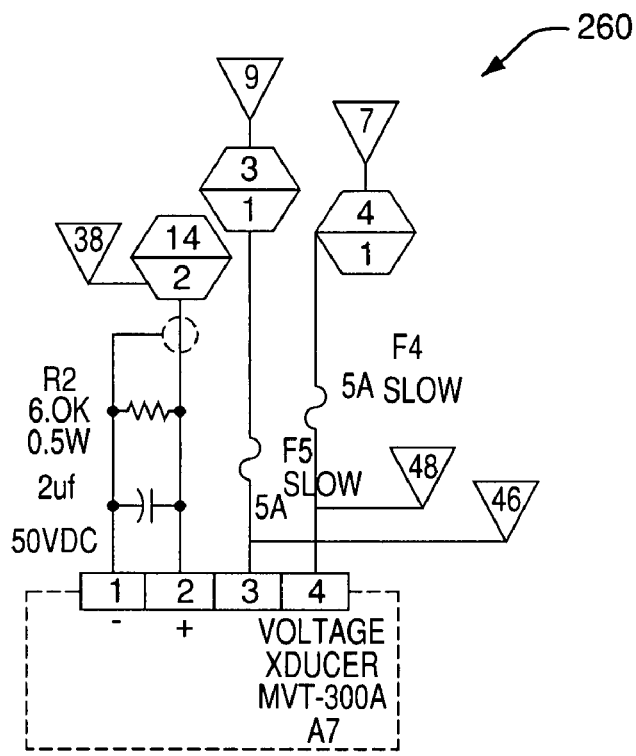
Figure 2E:
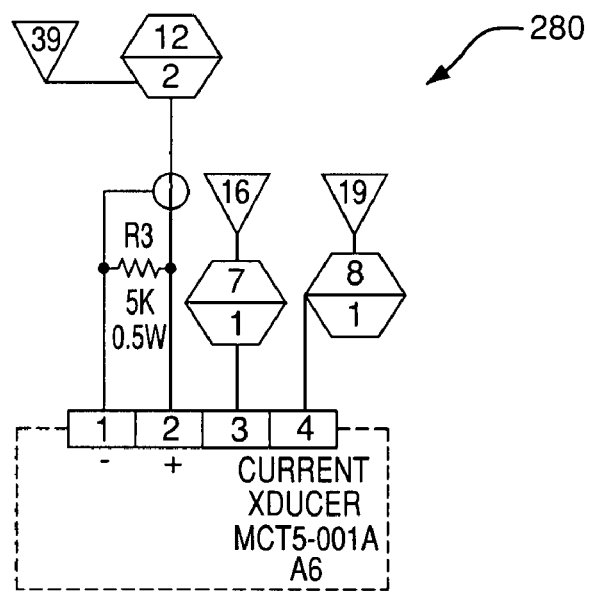
Figure 2F:
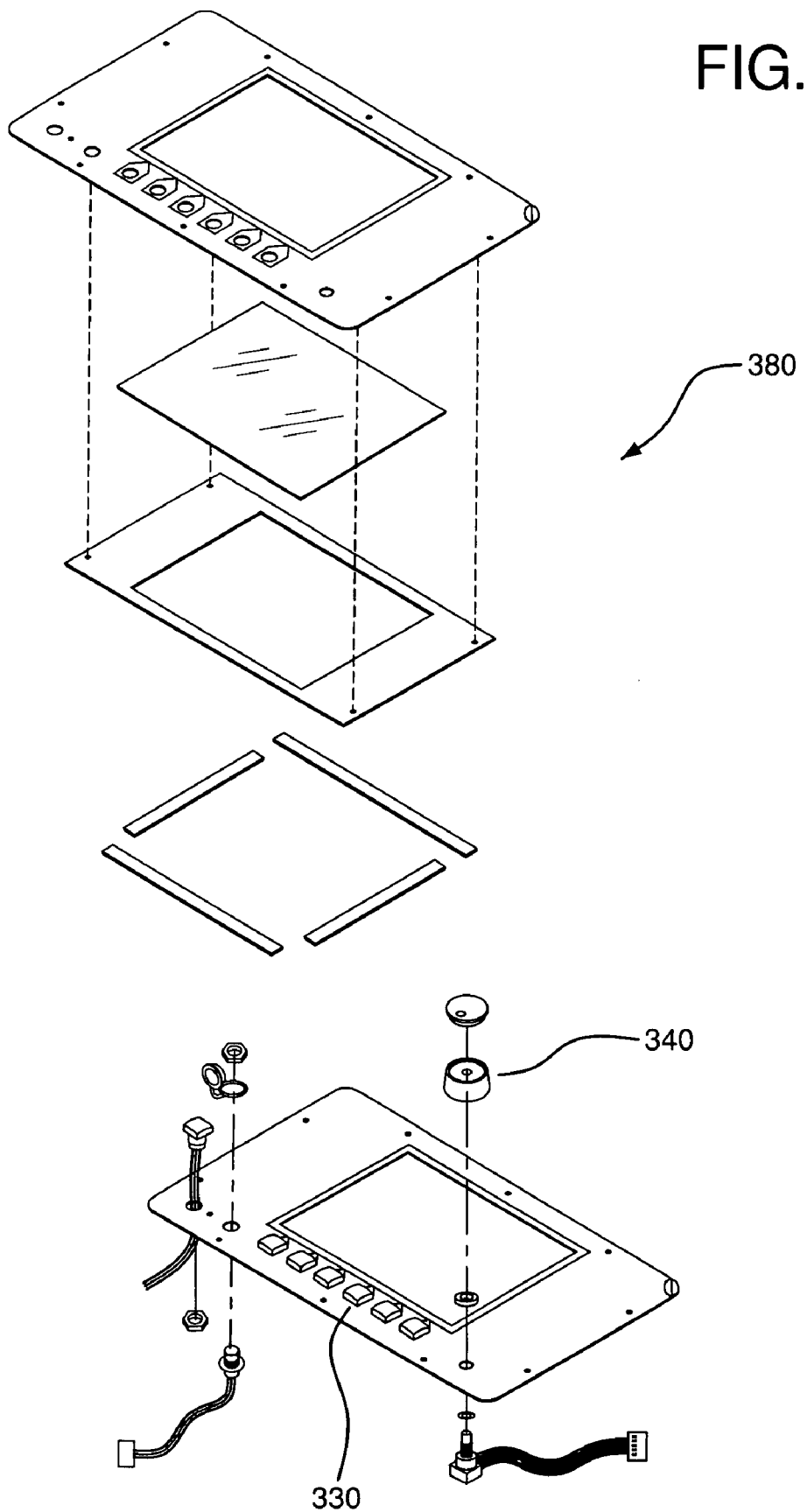
Figure 2G:
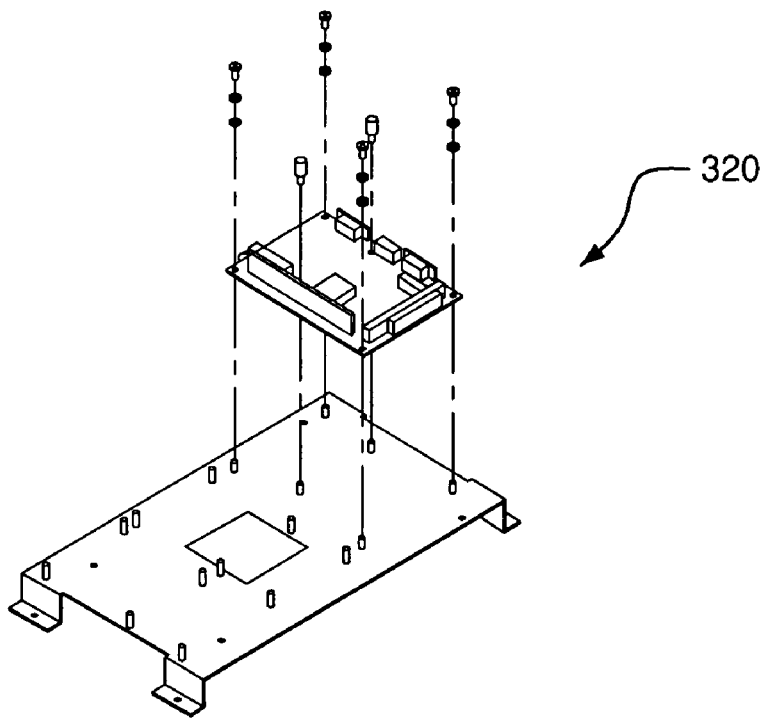
Figure 2H:
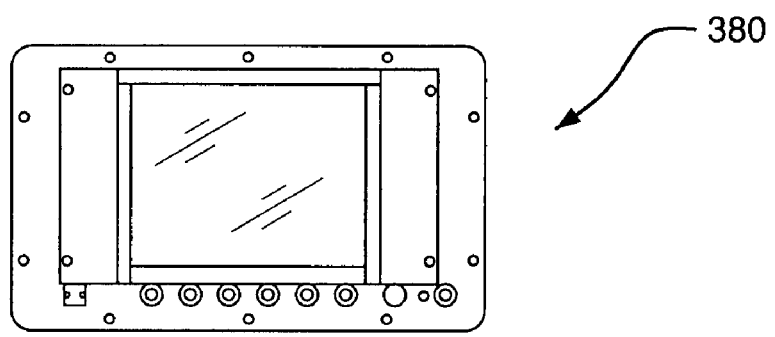
Figure 2I:
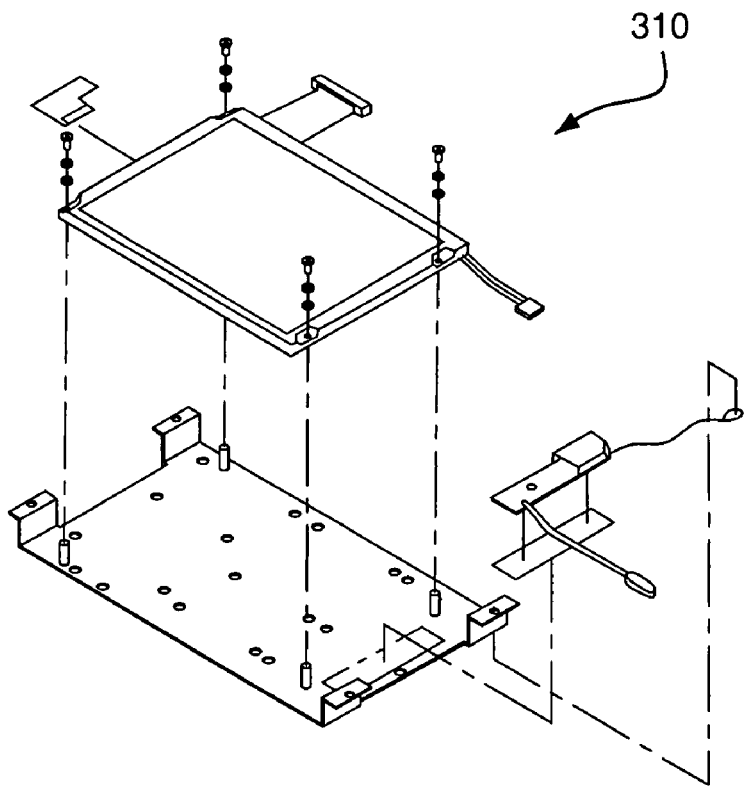
Figure 2J:
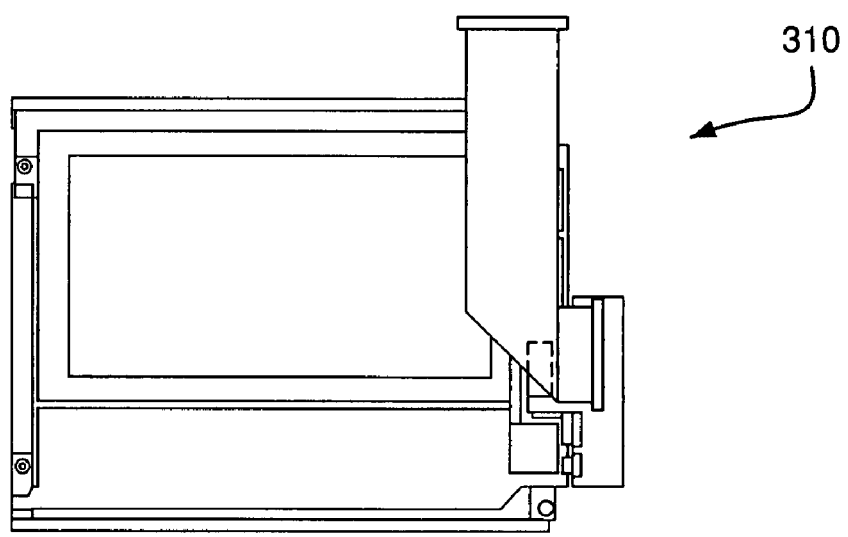
Figure 2K:
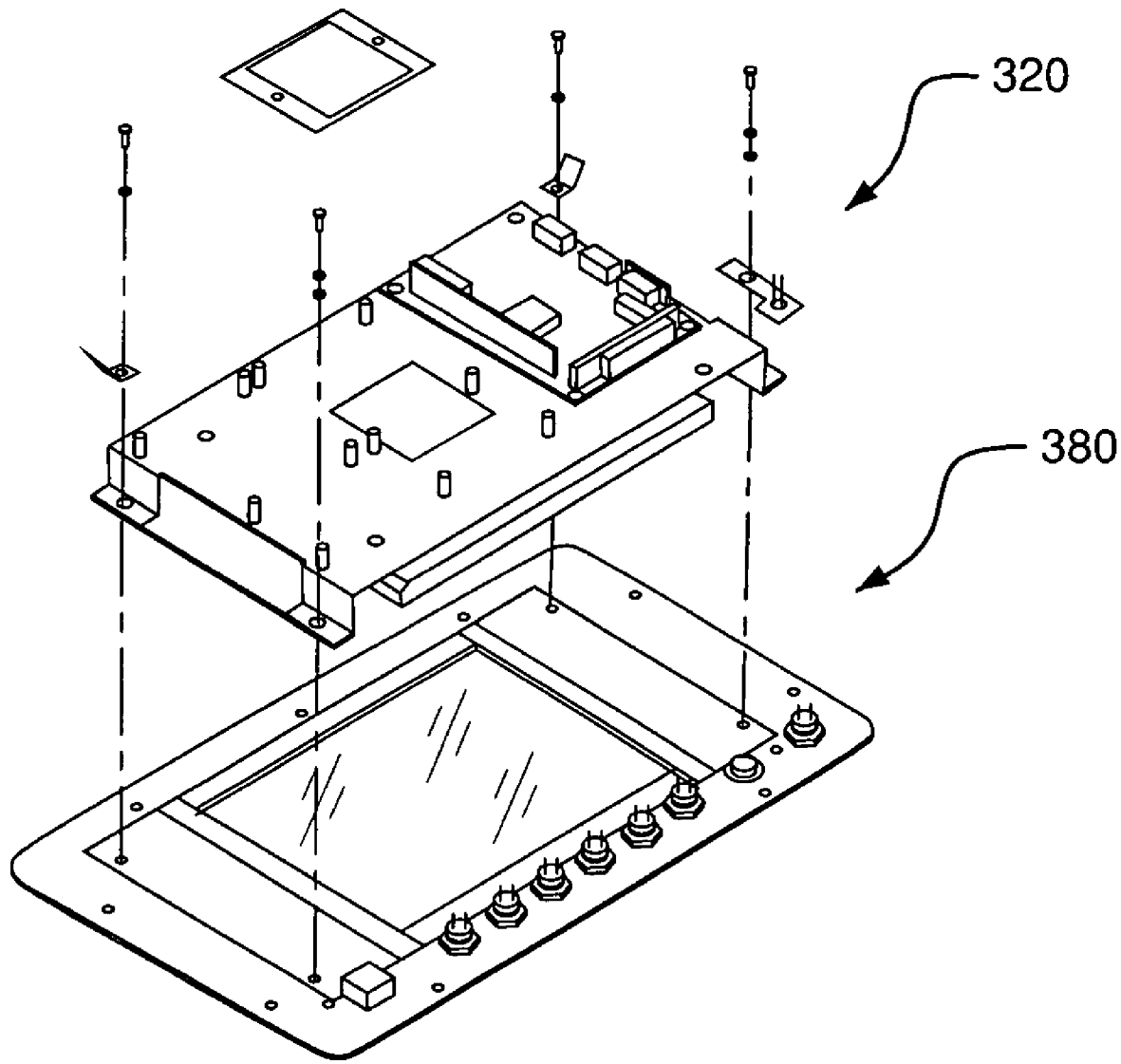
Figure 2I:
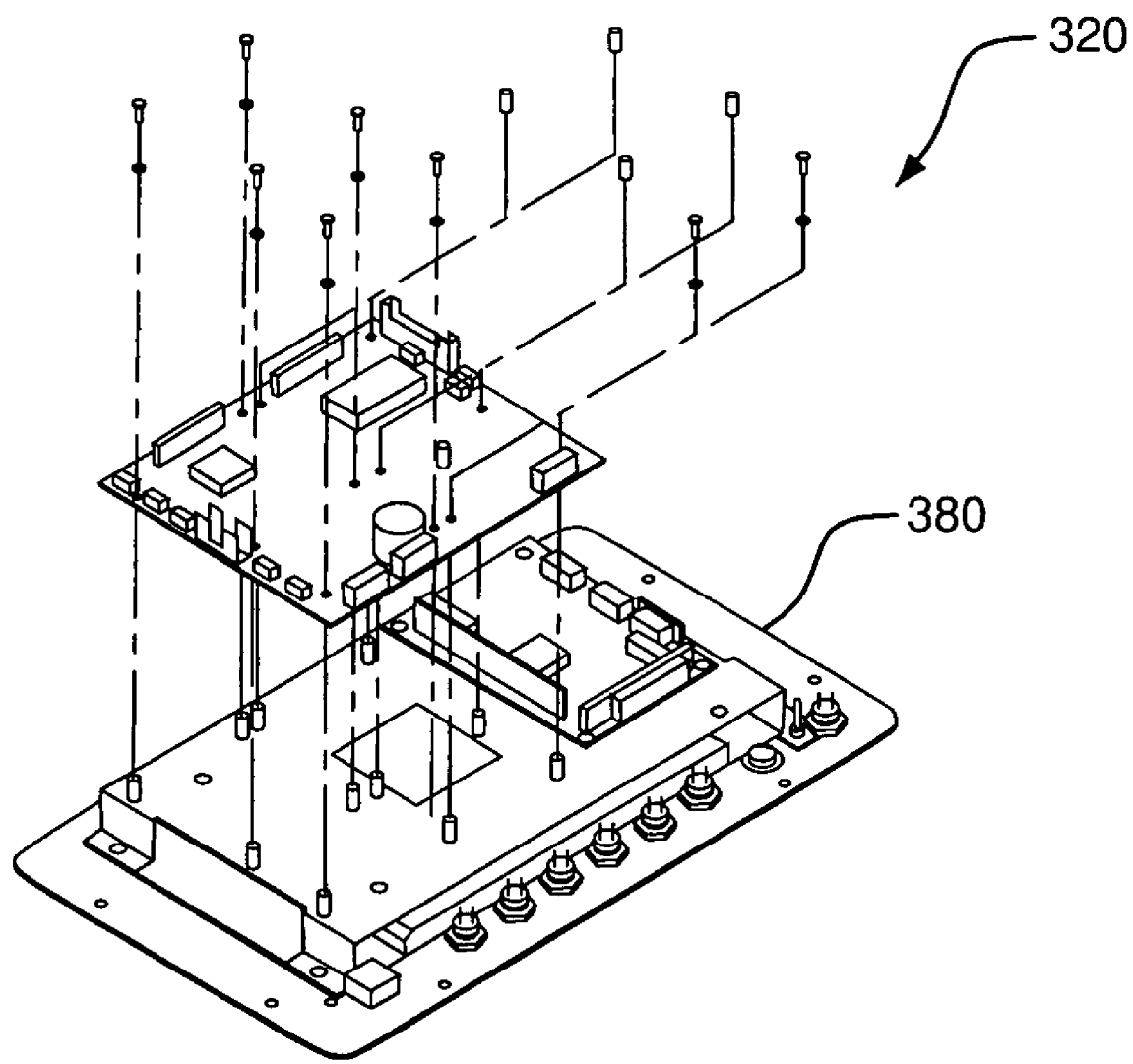
Figure 2M:
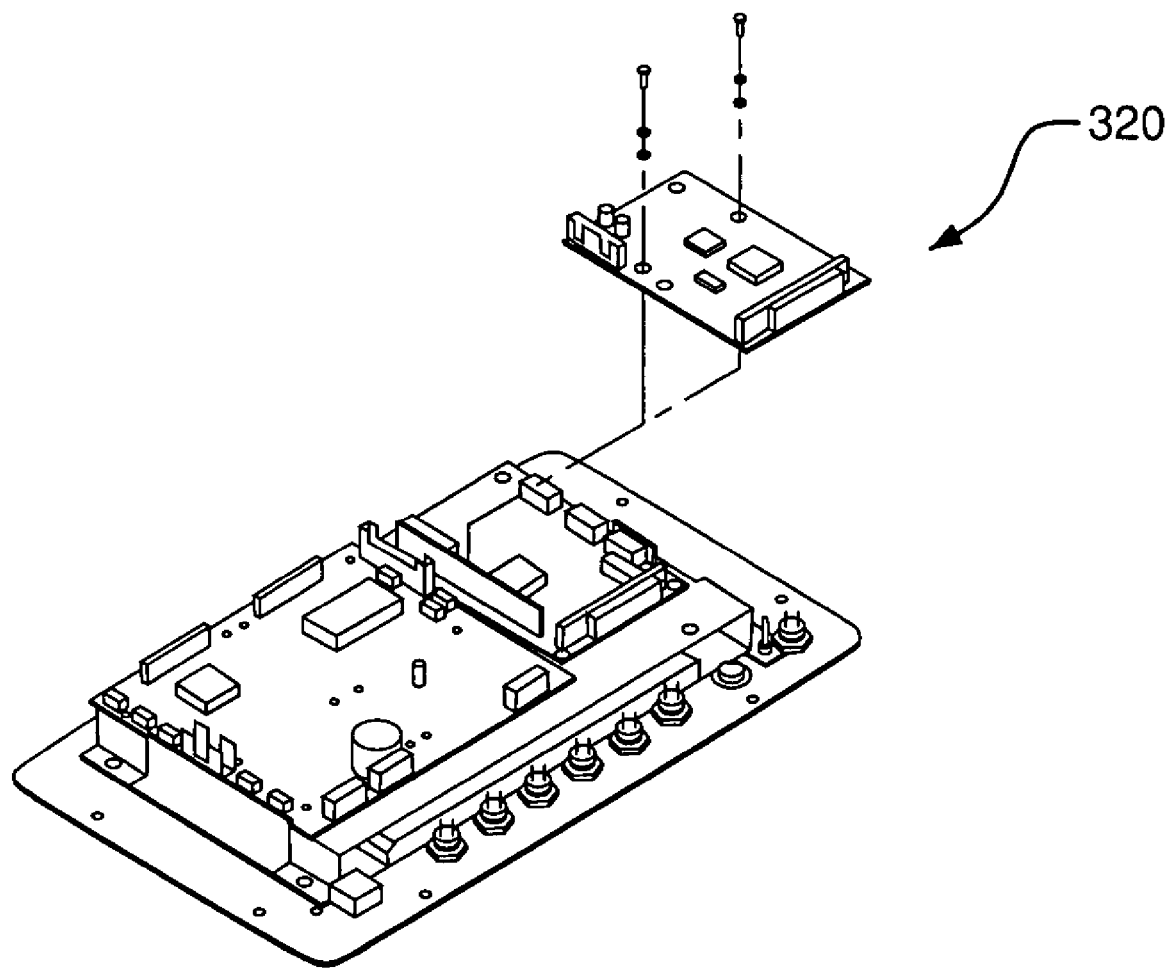

The current and measurement system (exemplary implementations for input current 260 and input voltage 280 measuring are illustrated in FIGS. 2d and 2e, respectively) allows the PLC controller to read auto transformer voltage and current along with high voltage output voltage and current. An analog meter is provided to indicate high voltage output, and is visible to the operator. This indicates that high voltage is present at the output for safety and is independent of the PLC control system. In an exemplary implementation as shown in FIGS. 2a, 2b, 2d and 2e, part 220 of PLC includes a 2 channel analog input for: high voltage output voltage (connection to part 260 via wire number 38) and current (connection to part 280 via wire number 39), variable DC output for motor speed control (connection to part 220 via wire number 40).

It is noted that in the illustrative examples of FIGS. 2a-2e: input and function switches are shown with power "OFF"; interlock and overhead contacts are shown closed for ease in trouble shooting; "A" and "B" lines supply control power and carry, for example 114 VAC; the resistors are, for example ½W±10%; capacitor values are in "UF"; ∇ symbol denotes wire numbers; and ℏsymbol denotes interconnections (top) between pages (bottom).

Figure 2N:
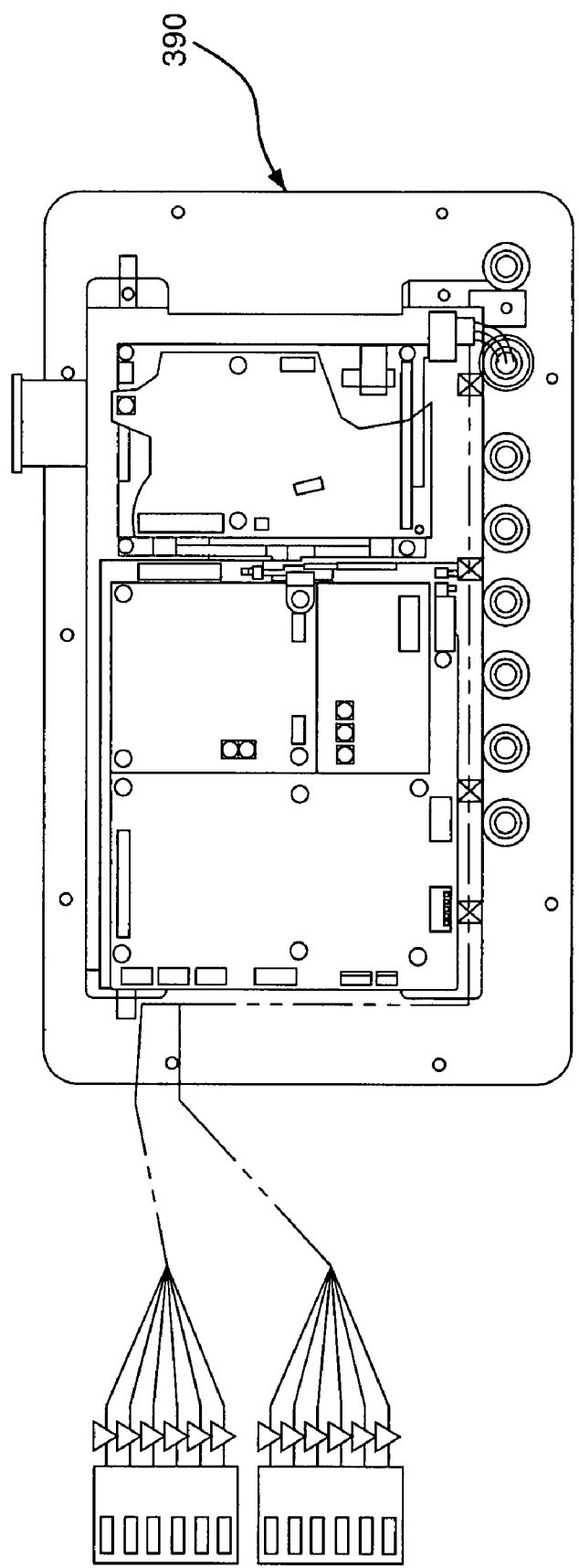
Figure 3A:
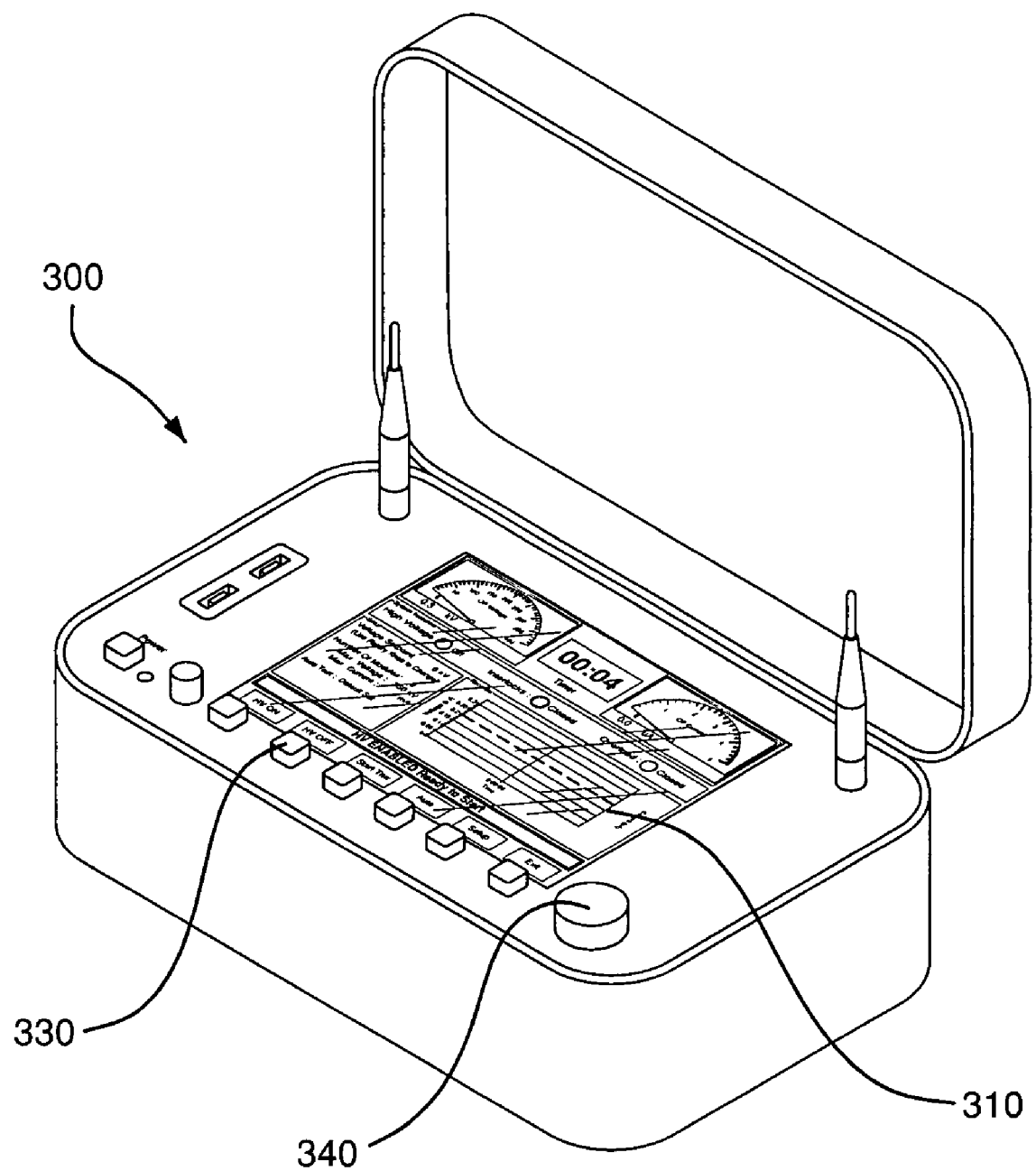
FIGS. 3a-3c show an example of an implementation of an embodiment of the present invention.
Figure 3B:
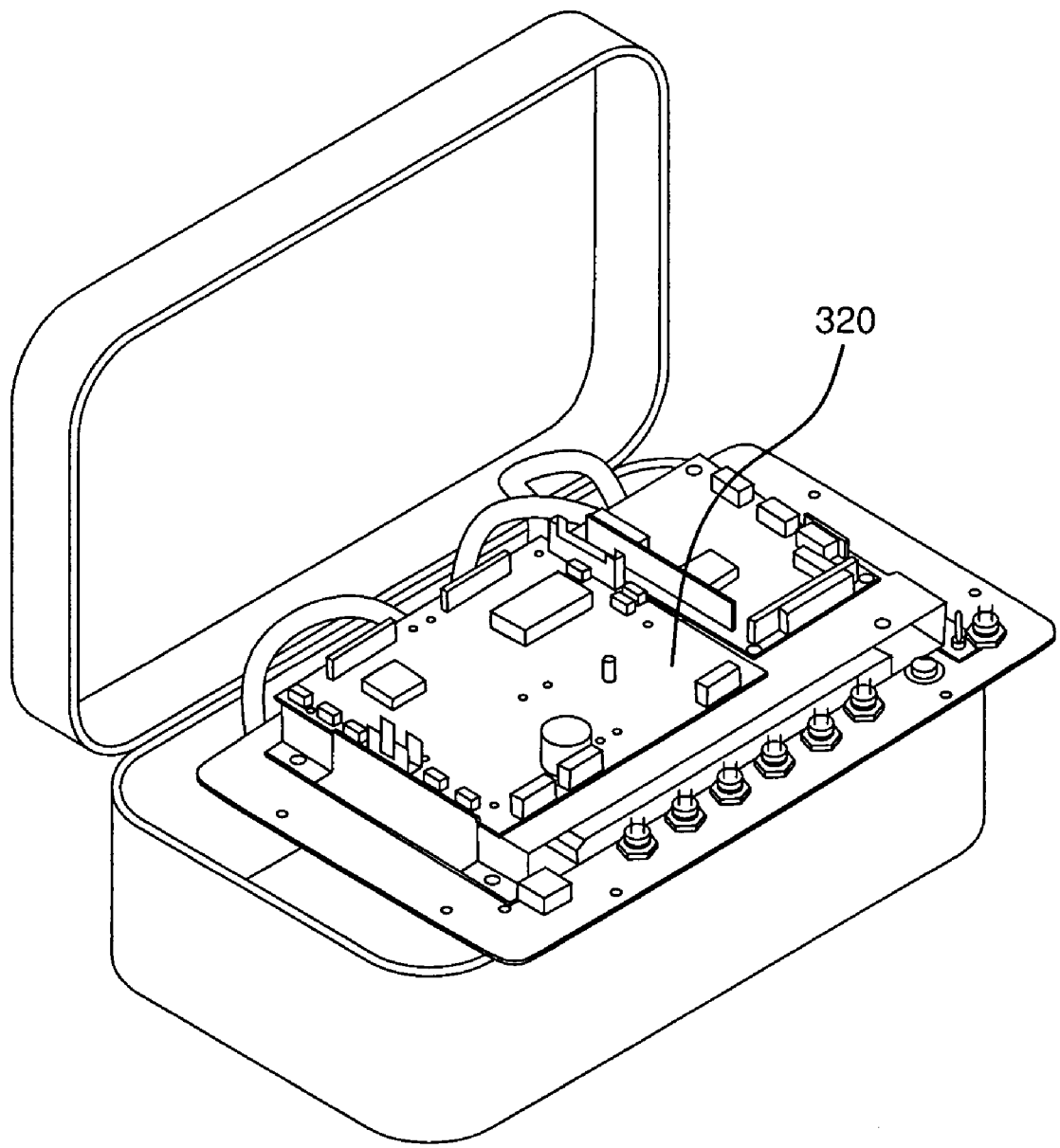
Figure 3C:
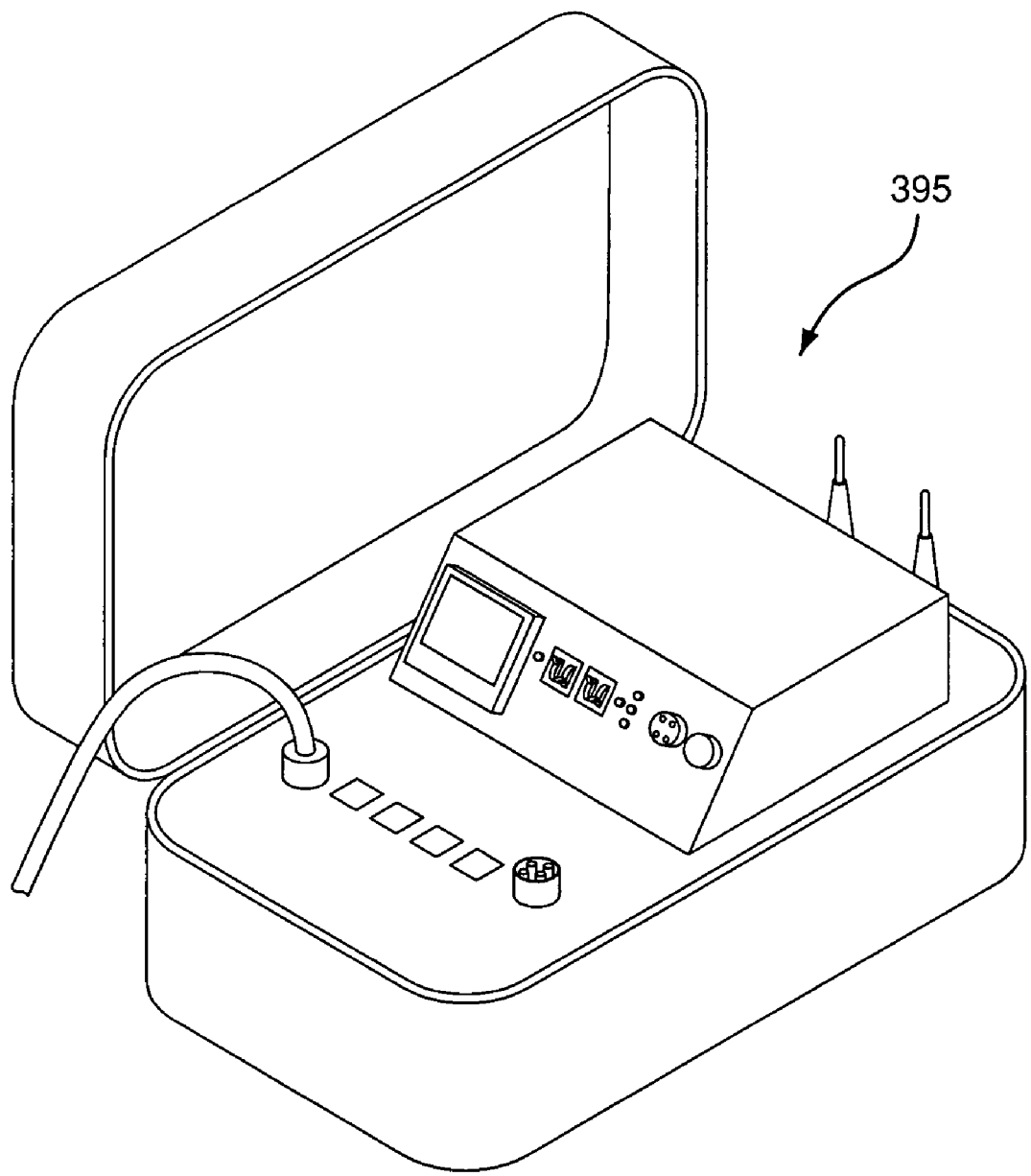

Referring to FIGS. 2f through 2n, components of controller 300 are shown in various stages of assembly thereof including top cover 380. Back view of the interior of assembled controller 300 is shown in FIG. 2n with chassis 390.

According to an exemplary implementation of the present invention, a wireless method of controlling a high voltage power supply utilizing IEEE 802.11 networking can be extended to include the range of products that Hipotronics currently manufacture. Each of these can then be controlled wirelessly. This allows the operator to be completely electrically isolated from the test system to increase safety.

In addition this allows the controller to wirelessly connect to different products, so that a user who needs to perform multiple tests on a part can use the same controller. All of the test results can then be integrated into one test report and sent out to the factory network if needed. Supervisors, mangers or other allowed persons can also then access the system to view progress or view results.

An exemplary implementation of a wireless modular DC hipot controller an regulator for use with portable hipot testers is described below. It is to be noted that according to yet another exemplary implementation, a system according to an embodiment of the present invention may offer a galvanically isolated operating platform for performing hipot tests up to 875 kV DC.

Figure 4:
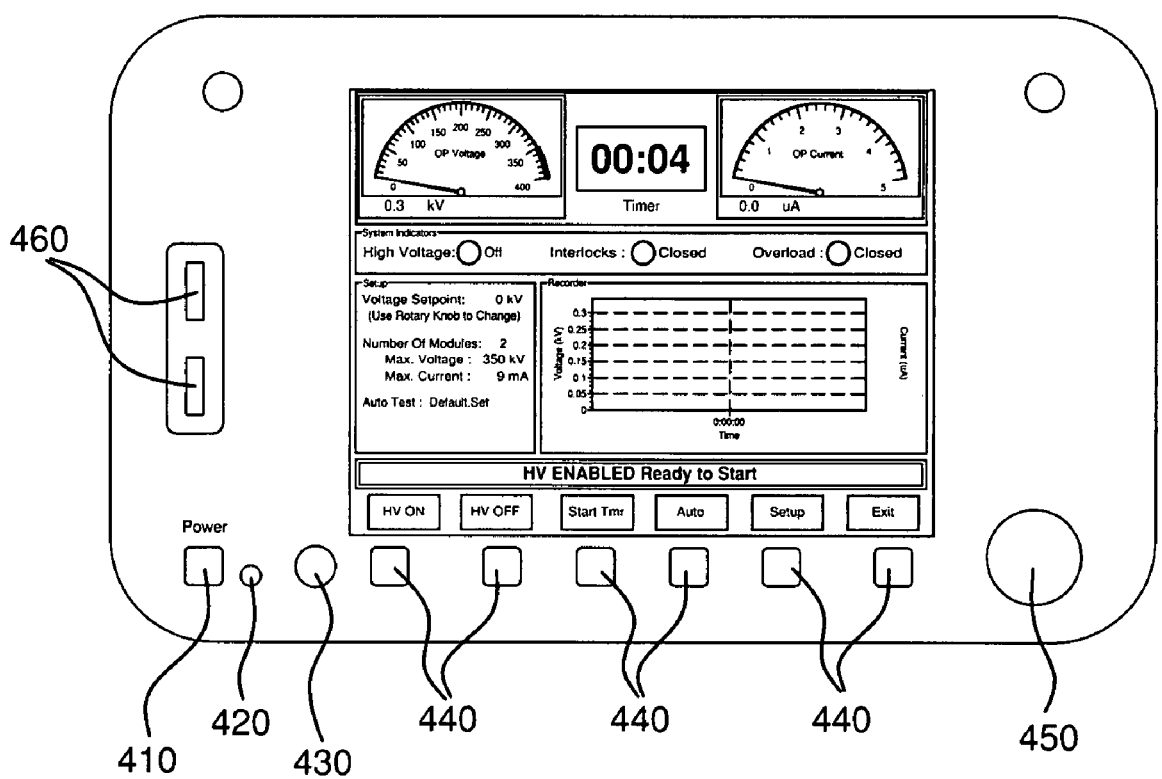
FIG. 4 shows another example of an implementation of an embodiment of the present invention.
Figure 5:
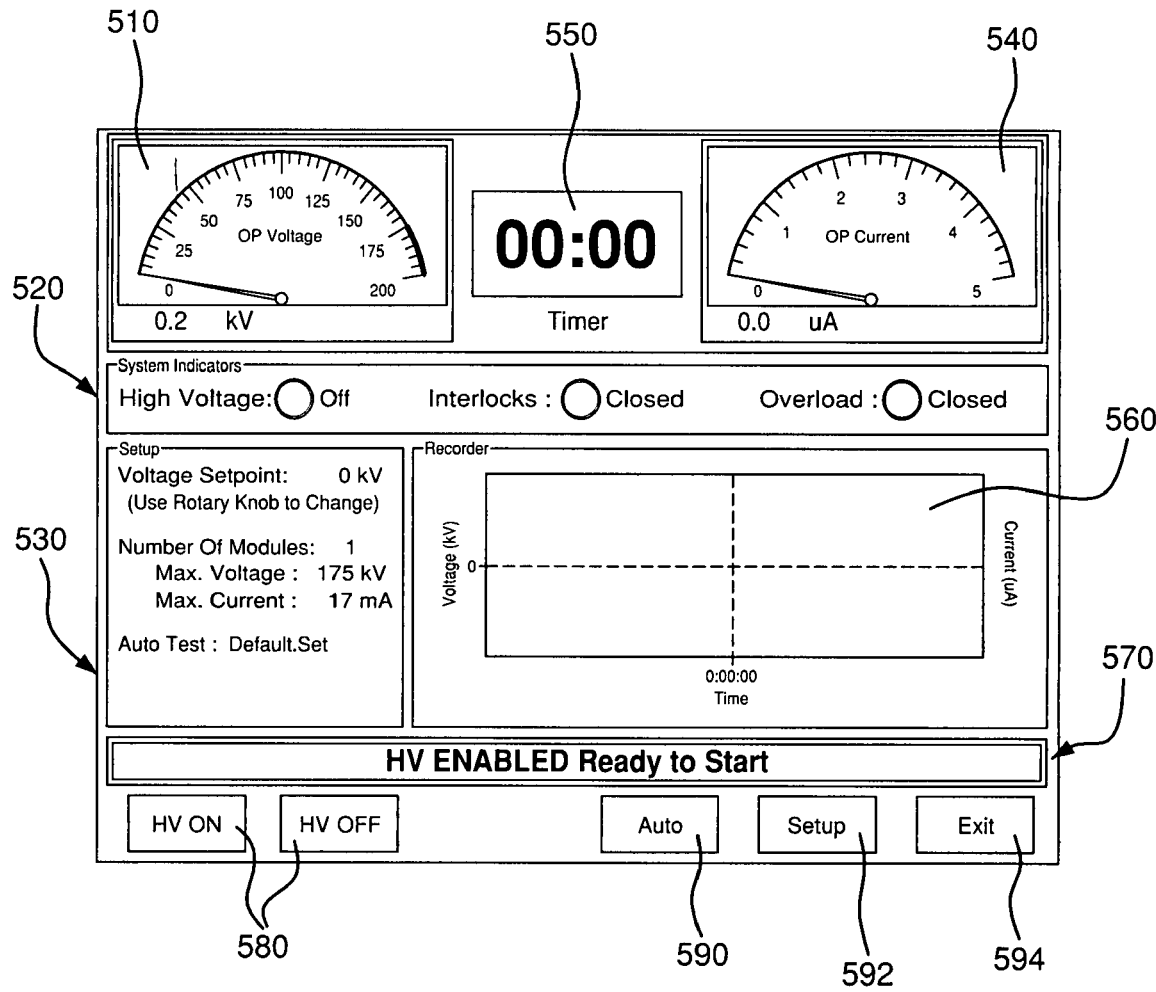
FIG. 5 shows another example of an implementation of an embodiment of the present invention.

Referring to FIG. 4, controls and indicators according to an exemplary implementation are as follows:
1. Power On/Off 410: Use this control to turn the unit on. The button should be held until the power indicator illuminates. The unit should NOT be turned off using this button, unless the software freezes, in which case holding the button for a period of 10 seconds will cause the unit to shut off. The unit cannot be turned back on after a shutdown, until a period of ten seconds has elapsed.
2. Power Indicator 420: This indicator illuminates when the control unit is turned on.
3. Serial Port 430: RS232 compatible serial port.
4. Software Control Buttons 440: The six buttons are used to select the options displayed on the screen by the software.
5. Rotary Controller 450: This control is used to change fields and values within the software.
6. USB Ports 460: These ports allow USB devices to be attached to the controller to enable data download, keyboard access etc Referring to FIG. 5, the information being displayed according to an exemplary implementation is as follows:
1. Volt Meter 510: Displays the output voltage in Kilo Volts.
2. Hardware Status 520: This panel shows the status of the regulator. I.e. HVON/OFF, Interlocks etc.
3. Setup Information 530: This panel shows the current information regarding the system setup. It shows the number of DC modules that the system is using, the Max voltage and Current and the Voltage setpoint. Also displayed on this panel is the name of the setup filename that is currently in use.
4. Current Meter 540: Displays the DC output current from the hipot stack. This meter is auto-ranging when the regulator is not raising or lowering, but defaults to the maximum scale during these operations.
5. Timer 550: This meter displays the time that the system has been at the setpoint value, unless the operating mode of the timer is set to 'manual' in which case the Start and Stop button will cause the timer to run or stop.
6. Recorder 560: When the high voltage is turned on the chart recorder will be logging. The recorder gives a graphical display of output voltage and current. The recorder will stop recording when HV is turned off.
7. PLC Status 570: All the processing and control within the regulator is carried out by a PLC controller. The message box at the bottom of the screen displays the current status of the PLC program, identifying if the PLC is raising voltage, holding at voltage, or any errors that the PLC has identified.
8. High Voltage Controls 580: These two controls are used to turn the HV on or off in manual operation and start and stop testing during automatic operation.
9. Mode Selection 590: This button toggles the controller-operating mode between manual and automatic.
10. Setup 592: This operator is used to enter the setup and calibration screens.
11. Exit 594: Used to turn off the controller.

Referring to FIGS. 6a-6e, control operations according to an exemplary implementation are as follows:

Powering up the Controls: The control unit should be positioned within 50 feet of a Wireless regulator. The AC power to the regulator should be turned to the on position. Hold the 'Power' button down on the control unit until the 'Power Indicator' is illuminated. The screen on the controller will light up and the internal computer will run through its' 'boot up' procedure. Do not turn the power off while the computer is booting. When the computer has finished booting the controller will try to connect to a regulator. (See FIG. 6a.)

Figure 6A:
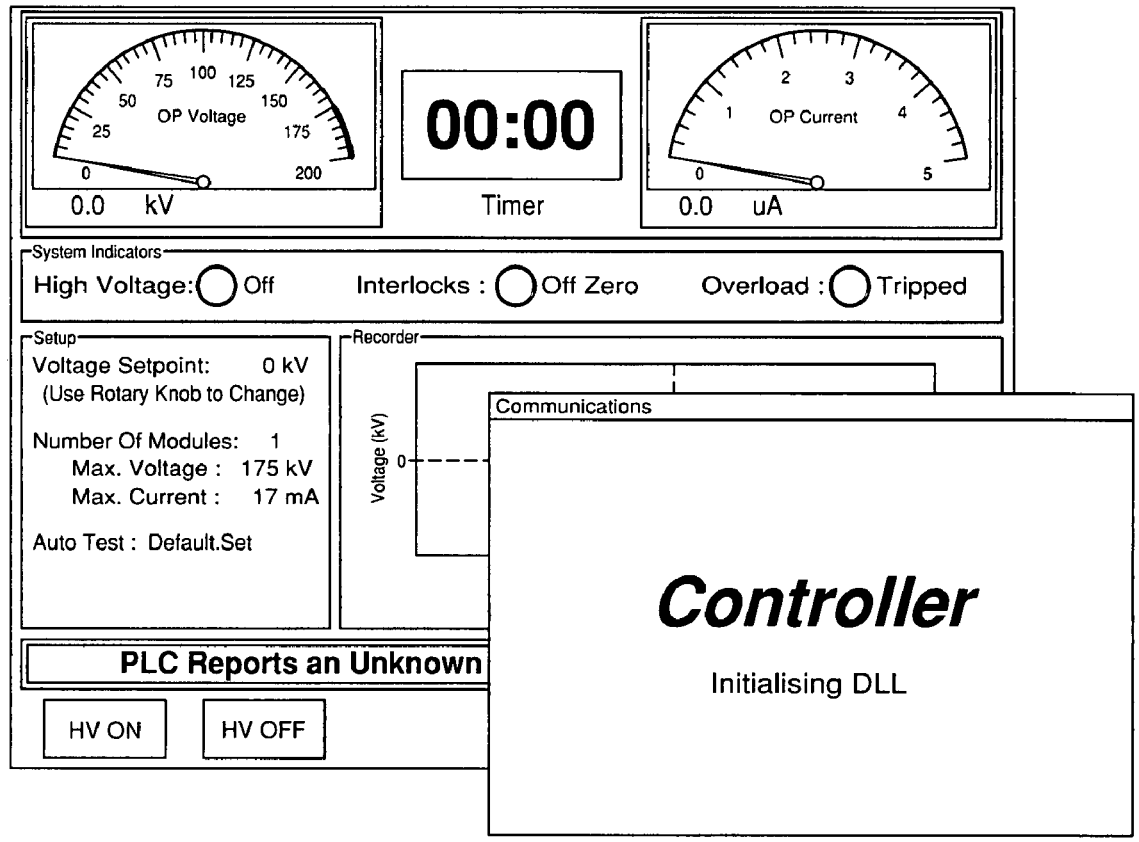
FIGS. 6a-6e show exemplary implementations of control operations according to an embodiment of the present invention.
Figure 6B:
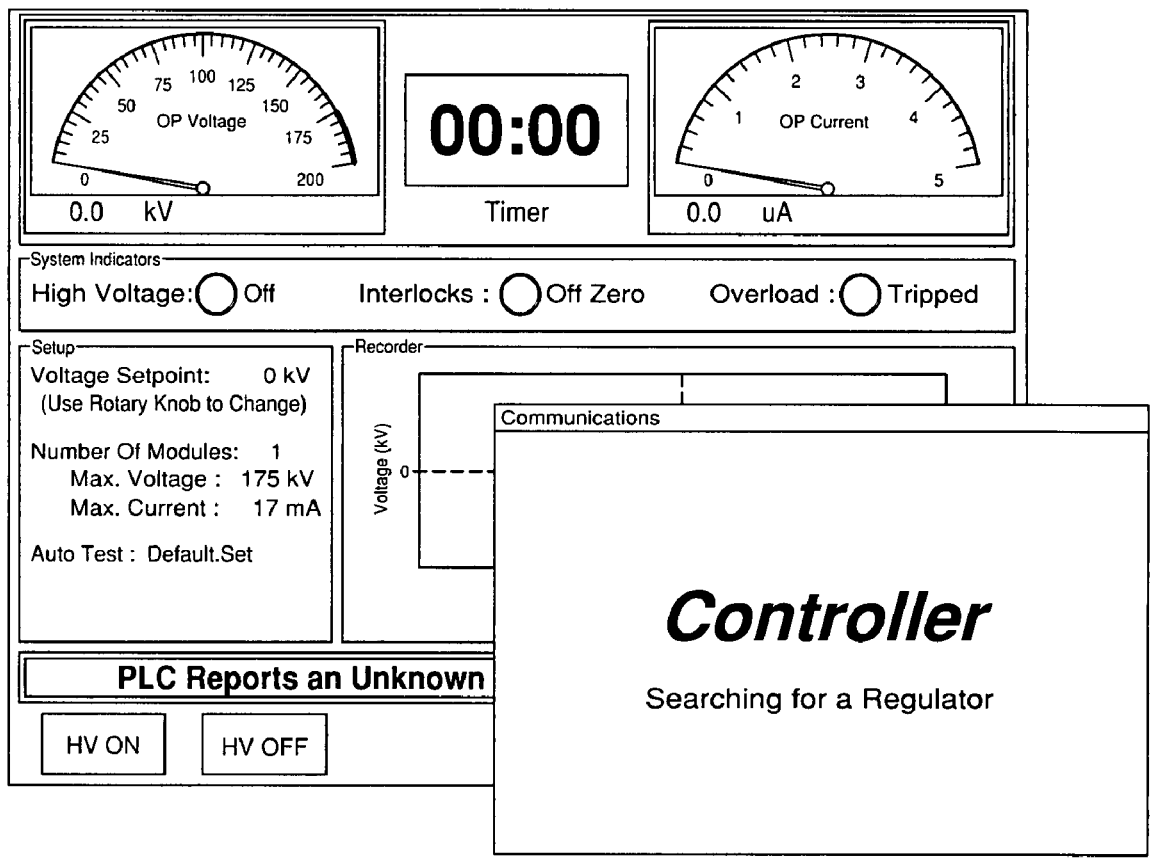

The software is initializing the internal drivers required to communicate with the network. A screen as shown in FIG. 6a will be present for about 1-2 seconds before it changes to a screen as shown in FIG. 6b.

Figure 6C:
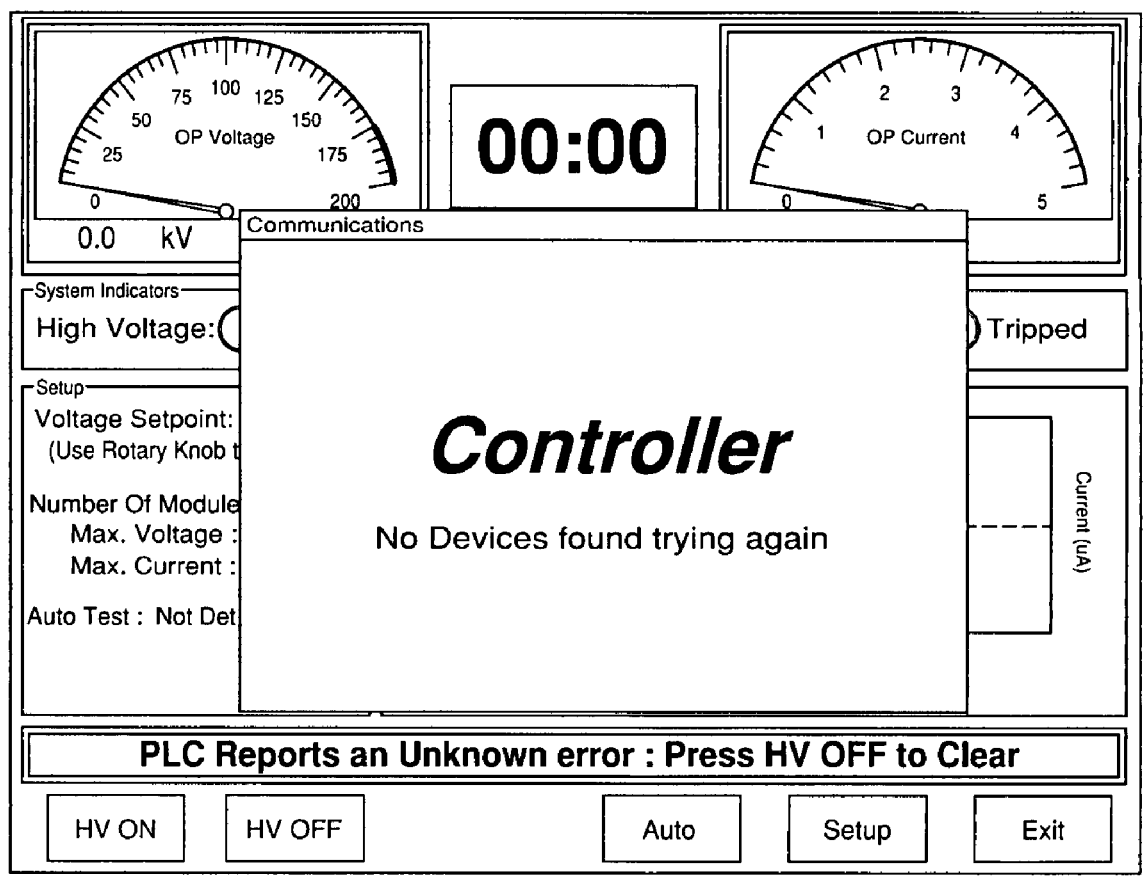

The controller is now searching the network to try and locate a compatible regulator device to communicate with. If there is no suitable regulator within range, or the regulator is not yet turned on, then the message as shown in FIG. 6c will be reported.

The controller will continue to display this message until the power is turned off, or a suitable regulator is brought into range and powered up. When a regulator has been found the message as shown in FIG. 6d appears.

Figure 6D:
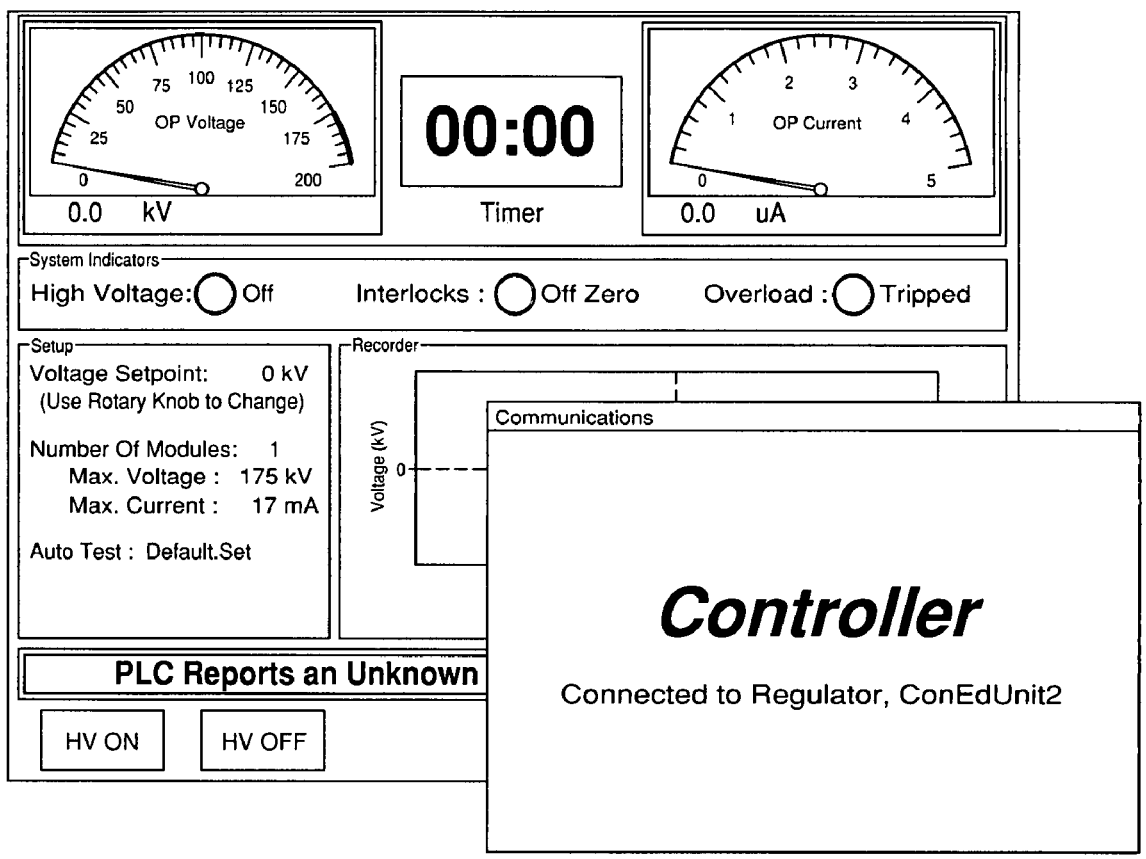
Figure 6E:
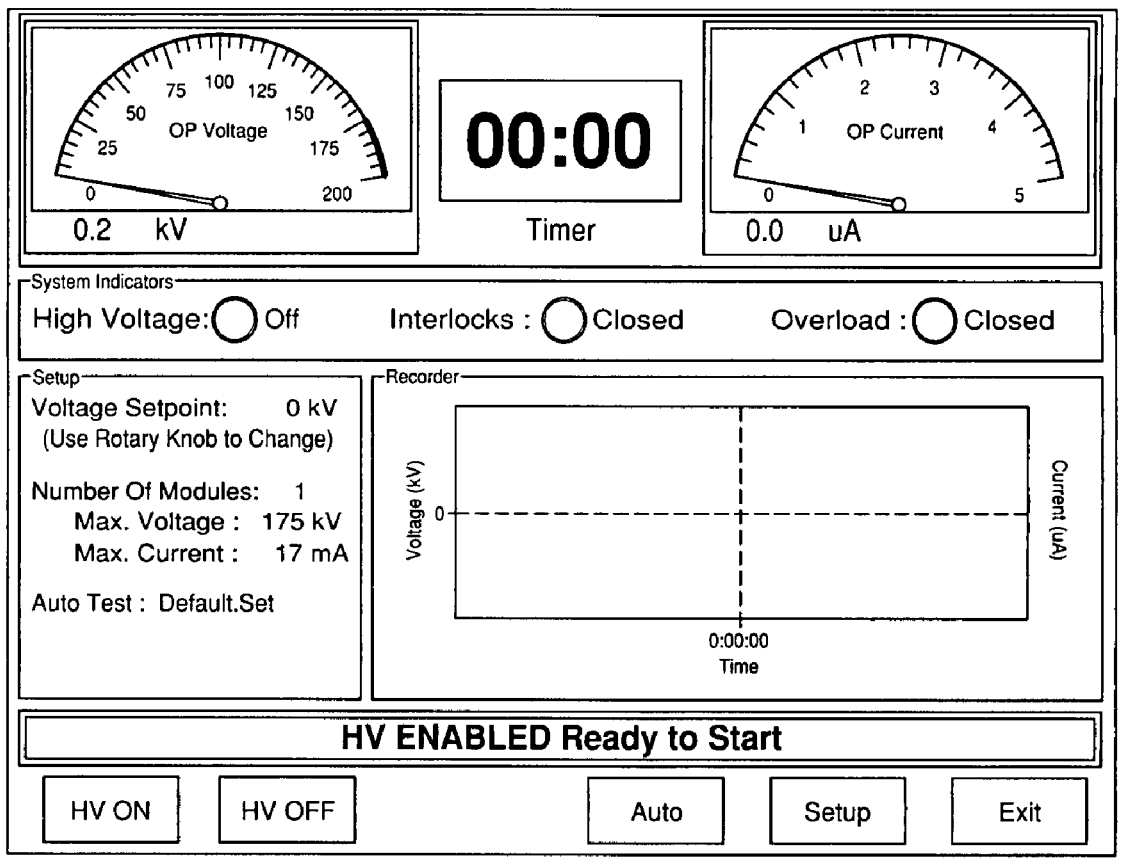

The screen of FIG. 6d shows that the controller has successfully connected to an 8175 regulator, which has been identified as 'ConEdUnit2'. The message box will now go away and the main operation screen will be visible, as shown in FIG. 6e.

According to an exemplary implementation, before operation it is necessary to ensure that the number of modules displayed on the screen matches the number of modules physically connected in the system. All the settings that affect the normal operation of the system can be adjusted by pressing the Setup button. The screen as shown in FIG. 7 will be displayed where:

Number Of Modules: The number of barrels that are being used with the system. This needs to be set for both manual and automatic modes of operation.

Ramp Rate: This setting controls the speed of the regulator when raising and lowering. It can be set for Slow, Medium or Fast. In general the setting should be left set to Medium, for high capacitance loads the slow setting may give better results.

Timer Mode: When running the controller in 'Manual' operating mode the dwell timer can be set to operate either manually or automatically. If the timer is set to manual, then it can be started and stopped at any time, if left in automatic, then the dwell timer will start counting as soon as the selected setpoint is reached and stop when the setpoint is changed, or the HV is turned off.

Automatic Test File Name: The name of the settings file that is currently in use. This file contains all the settings from the setup screen. The 'default' file is the file that will be used when the unit is first started up. A filename can be assigned to each automatic setup to enable a number of pre-defined test profiles to be stored on the computer.

Maximum test voltage: When running an Automatic test this is the voltage at which the hipot test is to be performed.

Hold Time: When running in Automatic mode this is the time to hold at the maximum test voltage.

Number Of Steps: By selecting the number of steps to greater than one, when an automatic test is run the controller will ramp to the maximum test voltage, but will stop at each step. I.e. if the max test voltage is set to 100 kv and the number of steps is set to ten, the controller will raise the voltage to 10 kV, hold for the time period defined in step hold time and then raise to 20 kV. The tenth step will take the output to 100 kV where the system will dwell for the time defined in the Hold Time field.

Step Hold Time: The time that the system will dwell at each step when running an automatic test.

Figure 8A:
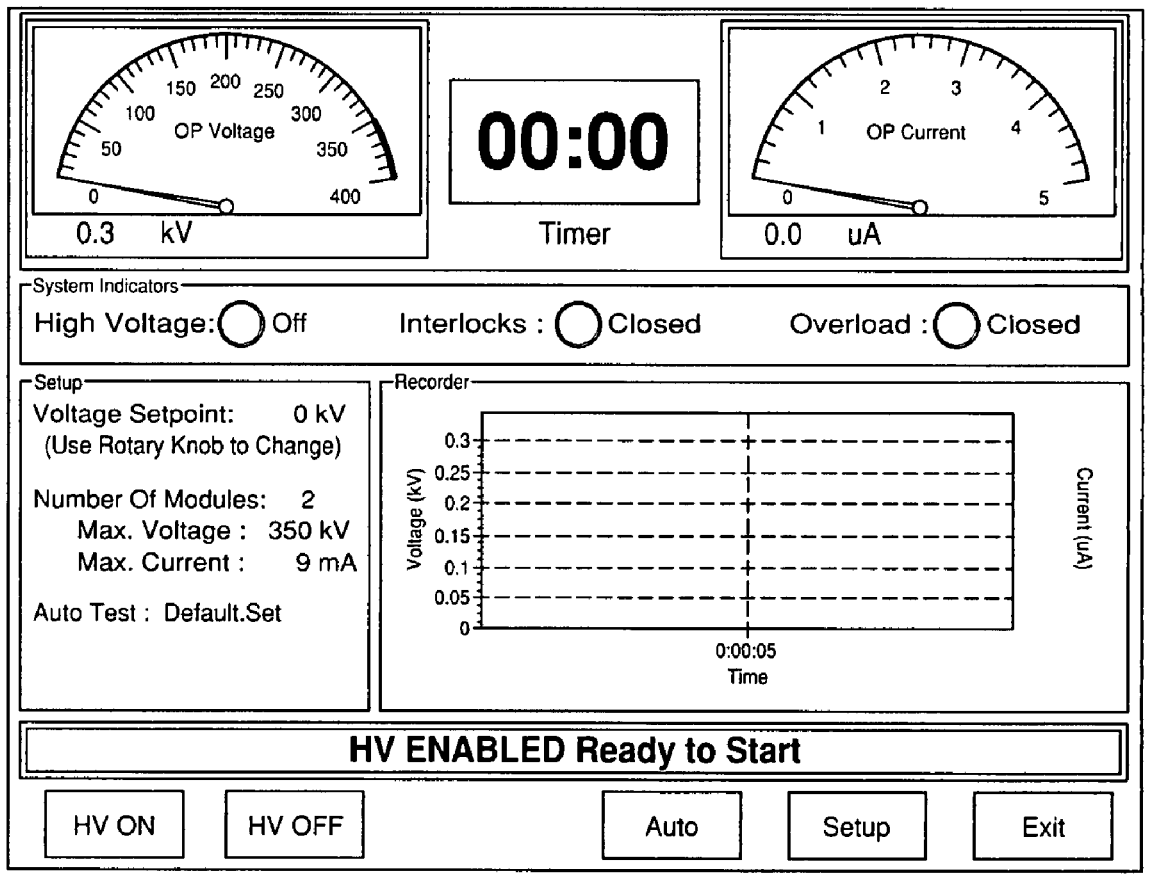
FIGS. 8a and 8b show an exemplary implementation of a manual test operation according to an embodiment of the present invention.
Figure 8B:
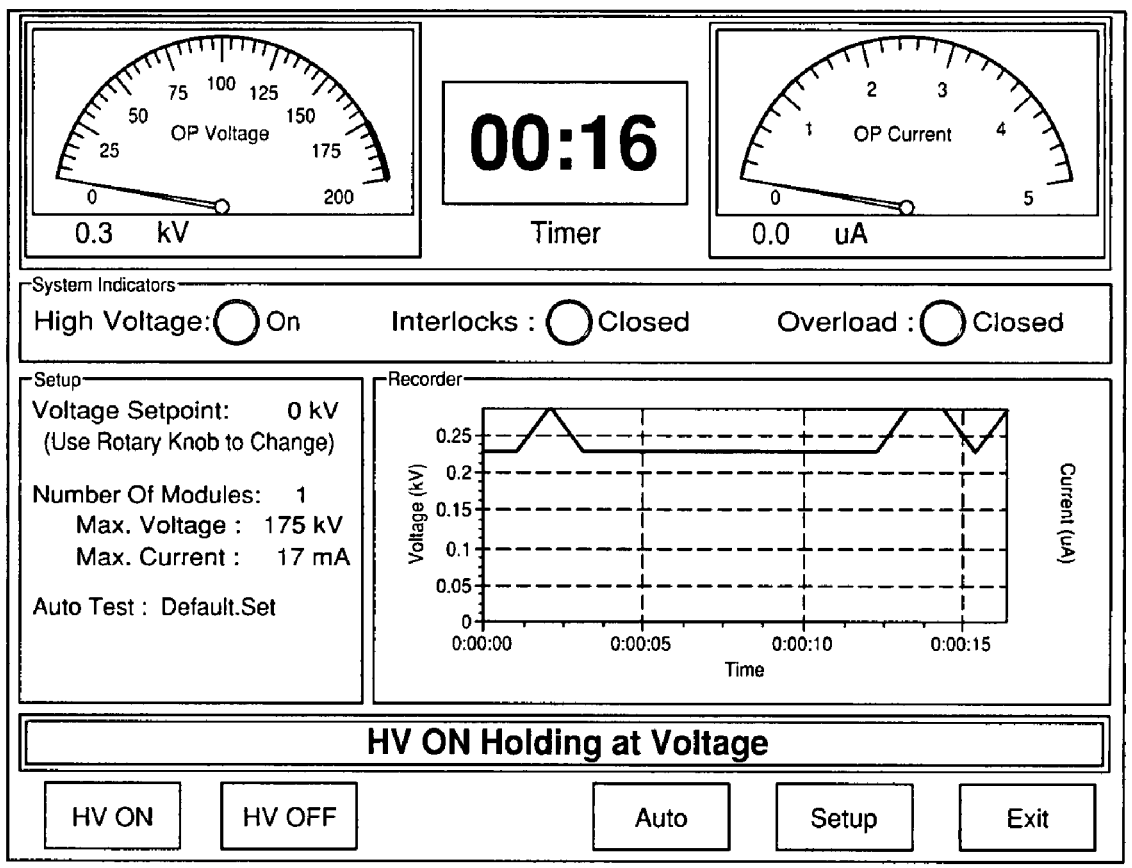

When running a manual test, according to an exemplary implementation, information as shown in FIGS. 8a and 8b is displayed. The following procedure may be followed:

1. Ensure that the setup is correct (see above section).
2. Turn on the High Voltage by pressing the 'HV ON' button.
3. After the High Voltage has been turned on, the controller reports 'HV ON Holding at Voltage'. To raise the voltage to the desired level, turn the rotary control to the right until the Voltage Setpoint reads the required voltage level. The controller will raise the output voltage until the setpoint is reached.
4. If the Timer Mode is set to automatic, then the timer will start to run when the output voltage reaches the target voltage. If the timer mode is set to manual, then the operator needs to press the 'Start Tmr' button to start the dwell timer running.
5. After the required dwell period, the setpoint should be reduced to zero, by turning the rotary control to the left.
6. Pressing the 'HV Off' button turns off the HV.

Figure 9:
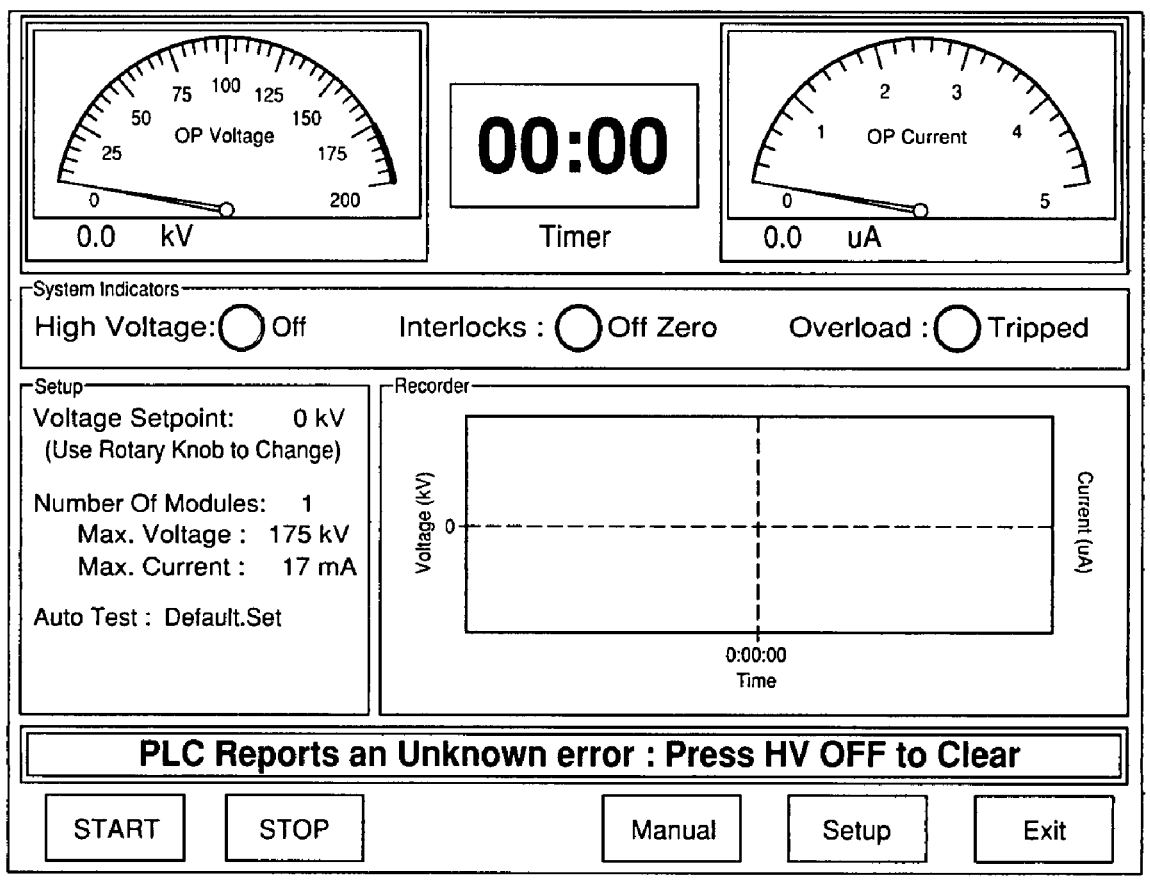
FIG. 9 shows another exemplary implementation of a manual test operation according to an embodiment of the present invention.

When running a manual test, according to an exemplary implementation, information as shown in FIG. 9 is displayed. The following procedure may be followed:

1. Select the test profile to be performed by either selecting a file from the setup screen, or by setting up the test using the automatic test parameters in the setup screen.
2. Press the 'Auto' button on the main operation screen. The left two buttons at the bottom of the screen will change to 'Start' and 'Stop'. (see FIG. 9).
3. To start the automatic test running, press the 'start' button. The hipot will now ramp to the first voltage step, as defined in the setup screen.
4. If the following parameters were set in the setup screen:

| Max Test Voltage: | 100 kV |
| Test Time: | 30 sec. |
| Number of steps: | 4 |
| Step Hold time: | 10 sec. |

Then the unit will ramp to 25 kV and wait for 10 secs, then raise to 50 kV and hold for 10 seconds, then 75 kV for 10 seconds and finally 100 kV for 30 seconds.

3. After the final test hold time the regulator will lower to zero. It will wait here until the output voltage drops to beneath 5 kV, before turning the HV off. The recorder will record Voltage and current from the moment the HV is turned on to the moment the HV is turned off.
6. If it is required to stop the test at any time, press the 'Stop' button. This will turn off the high voltage immediately. All recording functions will also stop at this point.

Numerous additional modifications and variations of the present invention are possible in light of the above teachings. It is therefore to be understood that within the scope of the appended claims, the present invention may be practiced otherwise than as specifically described herein.

We claim:
1. A system comprising:
a wireless controller configured to monitor at least one of a current and a voltage;
a first module for sensing first test data indicative of the at least one of the current and the voltage and supporting wireless communication with said wireless controller to provide information comprising said first test data to said wireless controller; and
a power supply which supplies power to said wireless controller;
wherein said wireless communication comprises wireless network communication and communication of first control information from said wireless controller to said module, said first control information comprising first test parameters for sensing said first test data.
2. The system as claimed in claim 1, wherein said wireless controller is galvanically isolated.
3. The system as claimed in claim 1, wherein said wireless communication comprises communication utilizing IEEE 802.11 networking standard.
4. The system as claimed in claim 1, wherein said power supply comprises at least one of a local main supply external to said wireless controller, a portable power source external to said wireless controller, and a battery internal to said wireless controller.
5. The system as claimed in claim 1 further comprising at least a second module for sensing second test data and supporting wireless communication with said wireless controller to provide information comprising said second test data to said wireless controller, wherein said wireless communication comprises communication of second control information from said wireless controller to said second module, said second control information comprising second test parameters for sensing said second test data.

6. The system as claimed in claim 5, wherein at least one of said first and second modules comprises a unique identifier, and said information provided from said at least one of said first and second modules to said wireless controller comprises said unique identifier.

7. The system as claimed in claim 1 further comprising a supervisory station configured to monitor at least said first test data via said wireless network communication.

8. The system as claimed in claim 1, wherein said first module comprises a number N of modular sections where N is an integer greater than or equal to 1, and said wireless controller has information indicative of the number N of said modular sections.

9. The system as claimed in claim 1, wherein said wireless controller stores at least one test profile comprising a set of test parameters for controlling said first module to sense said first test data.

10. The system as claimed in claim 1, wherein said wireless controller comprises a timer to facilitate control of said first module to sense said first test data at assigned time intervals and/or for an assigned period of time.

11. A wireless controller for high voltage test systems, the wireless controller comprising:
a wireless communication module for wirelessly sending data comprising first control data to a first high voltage testing module and for wirelessly receiving data comprising first test data indicative of at least one of a current and a voltage sensed by said first high voltage testing module, said first control data comprising first test parameters for sensing said first test data;
a display for displaying at least one of said first control data and said first test data;
a user interface for inputting at least a portion of said first control data; and
a connection to a power source;
wherein said wireless communication module is configured for connection to a wireless network.

12. The wireless controller as claimed in claim 11, wherein said wireless controller is galvanically isolated.

13. The wireless controller as claimed in claim 11, wherein said wireless communication module is configured to send at least said first test data to a supervisory station connected to said wireless network.

14. The wireless controller as claimed in claim 11, wherein:
said wireless communication module is further configured to wirelessly send data comprising second control data to a second high voltage testing module and to wirelessly receive data comprising second test data sensed by said second high voltage testing module, said second control data comprising second test parameters for sensing said second test data;
said display is further configured to display at least one of said second control data and said second test data; and
said user interface is further configured for inputting at least a portion of said second control data.

15. The wireless controller as claimed in claim 14, wherein at least one of said first and second high voltage testing modules comprises a unique identifier, and said wireless communication module is configured to associated said data received from at least one of said first and second high voltage testing modules with said unique identifier.

16. The wireless controller as claimed in claim 11, further comprises a storage for storing at least one test profile comprising a set of test parameters for controlling said first high voltage testing module to sense said first test data.

17. The wireless controller as claimed in claim 11, further comprising a timer to facilitate control of said first high voltage testing module to sense said first test data at assigned time intervals and/or for an assigned period of time.

18. A method for controlling a high voltage test system, the method comprising:
establishing a wireless connection between at least a first test module and a wireless controller;
wirelessly sending at least first control data from said wireless controller to at least said first test module; and
wirelessly receiving information comprising at least first test data indicative of at least one of a current and a voltage said first test module;
wherein said wireless connection comprises connection to a wireless network, said first control data comprises first test parameters for controlling said first test module to sense said first test data.

19. The method as claimed in claim 18, further comprising:
establishing a wireless connection between a second test module and said wireless controller;
wirelessly sending second control data from said wireless controller to said second test module; and
wirelessly receiving second test data from said second test module;
wherein said second control data comprises second test parameters for controlling said second test module to sense said second test data.

20. The method as claimed in claim 19, wherein at least one of said first and second test modules comprises a unique identifier, the method further comprising associating said information received from said at least one of said first and second modules with said unique identifier.

21. The method as claimed in claim 18 further comprising supplying power to said wireless controller.

22. The method as claimed in claim 18 further comprising maintaining galvanic isolation of said wireless controller.

23. The method as claimed in claim 18, wherein said first test data is received by said wireless controller, the method further comprising monitoring said first test data from a supervisory station.

24. The method as claimed in claim 18, wherein said first module comprises a number N of modular sections where N is an integer greater than or equal to 1, said method further comprising providing information indicative of the number N of said modular sections to said wireless controller.

25. The method as claimed in claim 18, further comprising storing in said wireless controller at least one test profile comprising a set of test parameters for controlling said first module to sense said first test data.

26. The method as claimed in claim 18, further comprising controlling said first module to sense said test data at assigned time intervals and/or for an assigned period of time.

* * * * *